(12) United States Patent
Thombare et al.

(10) Patent No.: US 9,478,411 B2
(45) Date of Patent: *Oct. 25, 2016

(54) METHOD TO TUNE $TIO_x$ STOICHIOMETRY USING ATOMIC LAYER DEPOSITED TI FILM TO MINIMIZE CONTACT RESISTANCE FOR $TIO_x$/TI BASED MIS CONTACT SCHEME FOR CMOS

(71) Applicant: Lam Research Corporation, Fremont, CA (US)

(72) Inventors: Shruti Vivek Thombare, Sunnyvale, CA (US); Ishtak Karim, San Jose, CA (US); Sanjay Gopinath, Fremont, CA (US); Reza Arghavani, Scotts Valley, CA (US); Michal Danek, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 134 days.

This patent is subject to a terminal disclaimer.

(21) Appl. No.: 14/464,475

(22) Filed: Aug. 20, 2014

(65) Prior Publication Data
US 2016/0056037 A1    Feb. 25, 2016

(51) Int. Cl.
*C23C 16/40* (2006.01)
*H01L 21/02* (2006.01)
(Continued)

(52) U.S. Cl.
CPC ......... *H01L 21/02186* (2013.01); *C23C 16/06* (2013.01); *C23C 16/405* (2013.01); *C23C 16/45529* (2013.01); *C23C 16/56* (2013.01);
(Continued)

(58) Field of Classification Search
CPC ................ C23C 16/40; C23C 16/405; C23C 16/45529; C23C 16/45536
See application file for complete search history.

(56) References Cited

U.S. PATENT DOCUMENTS

| | | | |
|---|---|---|---|
| 4,492,620 | A | 1/1985 | Matsuo et al. |
| 4,500,563 | A | 2/1985 | Ellenberger et al. |

(Continued)

FOREIGN PATENT DOCUMENTS

| | | |
|---|---|---|
| EP | 0 277 766 | 8/1988 |
| EP | 0 541 212 | 5/1993 |

(Continued)

OTHER PUBLICATIONS

Kukli, Kaupo, et al., "Atomic Layer Deposition of Titanium Oxide from TiI4 and H2O2". Chemical Vapor Deposition, 2000, 6, No. 6, pp. 303-310.*

(Continued)

*Primary Examiner* — Bret Chen
(74) *Attorney, Agent, or Firm* — Weaver Austin Villeneuve & Sampson LLP

(57) ABSTRACT

Methods of depositing and tuning deposition of sub-stoichiometric titanium oxide are provided. Methods involve depositing highly pure and conformal titanium on a substrate in a chamber by (i) exposing the substrate to titanium tetraiodide, (ii) purging the chamber, (iii) exposing the substrate to a plasma, (iv) purging the chamber, (v) repeating (i) through (iv), and treating the deposited titanium on the substrate to form sub-stoichiometric titanium oxide. Titanium oxide may also be deposited prior to depositing titanium on the substrate. Treatments include substrate exposure to an oxygen source and/or annealing the substrate.

17 Claims, 11 Drawing Sheets

(51) Int. Cl.
  *H01L 21/324* (2006.01)
  *H01J 37/32* (2006.01)
  *C23C 16/06* (2006.01)
  *C23C 16/455* (2006.01)
  *C23C 16/56* (2006.01)

(52) U.S. Cl.
  CPC .... *H01J 37/32082* (2013.01); *H01J 37/32449* (2013.01); *H01J 37/32724* (2013.01); *H01L 21/02238* (2013.01); *H01L 21/02274* (2013.01); *H01L 21/02301* (2013.01); *H01L 21/324* (2013.01)

(56) References Cited

U.S. PATENT DOCUMENTS

| | | |
|---|---|---|
| 4,609,903 A | 9/1986 | Toyokura et al. |
| 4,962,063 A | 10/1990 | Maydan et al. |
| 5,139,825 A | 8/1992 | Gordon et al. |
| 5,194,398 A | 3/1993 | Miyachi et al. |
| 5,223,443 A | 6/1993 | Chinn et al. |
| 5,496,608 A | 3/1996 | Matsuda et al. |
| 5,593,914 A | 1/1997 | Evans, Jr. et al. |
| 5,670,432 A | 9/1997 | Tsai |
| 5,700,519 A | 12/1997 | Lam |
| 5,856,003 A | 1/1999 | Chiu |
| 5,874,368 A | 2/1999 | Laxman et al. |
| 5,932,286 A | 8/1999 | Beinglass et al. |
| 5,961,791 A | 10/1999 | Frisa et al. |
| 5,962,923 A | 10/1999 | Xu et al. |
| 5,994,749 A | 11/1999 | Oda |
| 6,045,666 A | 4/2000 | Satitpunwaycha et al. |
| 6,054,382 A | 4/2000 | Hsu et al. |
| 6,090,709 A | 7/2000 | Kaloyeros et al. |
| 6,093,966 A | 7/2000 | Venkatraman et al. |
| 6,140,223 A | 10/2000 | Kim et al. |
| 6,191,033 B1 | 2/2001 | Liao et al. |
| 6,217,721 B1 | 4/2001 | Xu et al. |
| 6,235,163 B1 | 5/2001 | Angelo et al. |
| 6,270,572 B1 | 8/2001 | Kim et al. |
| 6,271,591 B1 | 8/2001 | Dubin et al. |
| 6,333,547 B1 | 12/2001 | Tanaka et al. |
| 6,337,151 B1 | 1/2002 | Uzoh et al. |
| 6,342,448 B1 | 1/2002 | Lin et al. |
| 6,346,741 B1 | 2/2002 | Van Buskirk et al. |
| 6,350,688 B1 | 2/2002 | Liu et al. |
| 6,391,803 B1 | 5/2002 | Kim et al. |
| 6,416,822 B1 | 7/2002 | Chiang et al. |
| 6,428,859 B1 | 8/2002 | Chiang et al. |
| 6,468,924 B2 | 10/2002 | Lee et al. |
| 6,509,601 B1 | 1/2003 | Lee et al. |
| 6,528,430 B2 | 3/2003 | Kwan et al. |
| 6,541,374 B1 | 4/2003 | de Felipe et al. |
| 6,551,893 B1 | 4/2003 | Zheng et al. |
| 6,566,246 B1 | 5/2003 | de Felipe et al. |
| 6,569,783 B2 | 5/2003 | Uzoh et al. |
| 6,576,053 B1 | 6/2003 | Kim et al. |
| 6,632,478 B2 | 10/2003 | Gaillard et al. |
| 6,645,574 B1 | 11/2003 | Lee et al. |
| 6,689,220 B1 | 2/2004 | Nguyen |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,765,303 B1 | 7/2004 | Krivokapic |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,841,044 B1 | 1/2005 | Ruzic |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 | 8/2005 | Chou et al. |
| 6,943,092 B2 | 9/2005 | Kim et al. |
| 6,962,876 B2 | 11/2005 | Ahn et al. |
| 6,967,154 B2 | 11/2005 | Meng et al. |
| 6,987,240 B2 | 1/2006 | Jennings et al. |
| 6,995,471 B2 | 2/2006 | Shue et al. |
| 7,001,844 B2 | 2/2006 | Chakravarti et al. |
| 7,041,335 B2 | 5/2006 | Chung |
| 7,041,595 B2 | 5/2006 | Chopra |
| 7,077,904 B2 | 7/2006 | Cho et al. |
| 7,081,271 B2 | 7/2006 | Chung et al. |
| 7,109,129 B1 | 9/2006 | Papasouliotis |
| 7,115,528 B2 | 10/2006 | Vaartstra et al. |
| 7,122,222 B2 | 10/2006 | Xiao et al. |
| 7,122,464 B2 | 10/2006 | Vaarstra |
| 7,125,815 B2 | 10/2006 | Vaartstra |
| 7,132,353 B1 | 11/2006 | Xia et al. |
| 7,141,278 B2 | 11/2006 | Koh et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,355,254 B2 | 4/2008 | Datta et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,473,638 B2 * | 1/2009 | Yang .............. C23C 16/06 257/E21.17 |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,670,646 B2 | 3/2010 | Ahn et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,727,882 B1 | 6/2010 | Wu et al. |
| 7,758,920 B2 | 7/2010 | Hasebe et al. |
| 7,776,733 B2 | 8/2010 | Hasegawa |
| 7,825,039 B2 | 11/2010 | Takahashi et al. |
| 7,906,168 B2 | 3/2011 | Hasebe et al. |
| 7,919,416 B2 | 4/2011 | Lee et al. |
| 7,923,068 B2 | 4/2011 | Dickey et al. |

(56) References Cited

U.S. PATENT DOCUMENTS

| | | |
|---|---|---|
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,456,007 B2 | 6/2013 | Sandhu et al. |
| 8,524,612 B2 | 9/2013 | Li et al. |
| 8,592,328 B2 | 11/2013 | Hausmann et al. |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,956 B2 | 5/2014 | LaVoie et al. |
| 8,956,983 B2 | 2/2015 | Swaminathan et al. |
| 8,999,859 B2 | 4/2015 | Swaminathan et al. |
| 9,076,646 B2 | 7/2015 | Sims et al. |
| 9,153,486 B2 | 10/2015 | Arghavani et al. |
| 9,214,334 B2 | 12/2015 | Swaminathan et al. |
| 9,230,800 B2 | 1/2016 | LaVoie et al. |
| 9,257,274 B2 | 2/2016 | Kang et al. |
| 9,287,113 B2 | 3/2016 | Kang et al. |
| 2001/0039113 A1 | 11/2001 | Blalock et al. |
| 2001/0054769 A1 | 12/2001 | Raajimakers et al. |
| 2002/0076507 A1 | 6/2002 | Chiang et al. |
| 2003/0008070 A1 | 1/2003 | Seutter et al. |
| 2003/0024477 A1 | 2/2003 | Okuda et al. |
| 2003/0200917 A1 | 10/2003 | Vaartstra |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0212041 A1* | 10/2004 | Takamatsu ........ H01L 27/11502 257/534 |
| 2004/0219746 A1 | 11/2004 | Vaartstra et al. |
| 2004/0231799 A1 | 11/2004 | Lee et al. |
| 2005/0042865 A1 | 2/2005 | Cabral et al. |
| 2005/0079661 A1 | 4/2005 | Cho |
| 2005/0085070 A1 | 4/2005 | Park |
| 2005/0109276 A1 | 5/2005 | Iyer et al. |
| 2005/0118837 A1 | 6/2005 | Todd et al. |
| 2005/0159017 A1 | 7/2005 | Kim et al. |
| 2005/0181535 A1 | 8/2005 | Yun et al. |
| 2005/0186793 A1 | 8/2005 | Omoto et al. |
| 2005/0196977 A1 | 9/2005 | Saito et al. |
| 2005/0233553 A1 | 10/2005 | Kountz et al. |
| 2005/0255700 A1 | 11/2005 | Gopalraja et al. |
| 2005/0260347 A1 | 11/2005 | Narwankar et al. |
| 2005/0276099 A1 | 12/2005 | Horng et al. |
| 2005/0287775 A1 | 12/2005 | Hasebe et al. |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0145190 A1 | 7/2006 | Salzman et al. |
| 2006/0165890 A1 | 7/2006 | Kaushal et al. |
| 2006/0199357 A1 | 9/2006 | Wan et al. |
| 2006/0211244 A1 | 9/2006 | Deshpande et al. |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0018214 A1 | 1/2007 | Ahn et al. |
| 2007/0020922 A1 | 1/2007 | Chiang et al. |
| 2007/0065576 A1 | 3/2007 | Singh et al. |
| 2007/0134942 A1 | 6/2007 | Ahn et al. |
| 2007/0137572 A1 | 6/2007 | Matsuura et al. |
| 2007/0167028 A1 | 7/2007 | Chou et al. |
| 2007/0193982 A1 | 8/2007 | Brown et al. |
| 2007/0200243 A1 | 8/2007 | Kraus et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0251444 A1 | 11/2007 | Gros-Jean et al. |
| 2007/0259110 A1 | 11/2007 | Mahajani et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0087890 A1* | 4/2008 | Ahn ........ C23C 16/405 257/43 |
| 2008/0123394 A1 | 5/2008 | Lee et al. |
| 2008/0131601 A1 | 6/2008 | Kim et al. |
| 2008/0139003 A1 | 6/2008 | Pirzada et al. |
| 2008/0213479 A1 | 9/2008 | Chou et al. |
| 2008/0242116 A1 | 10/2008 | Clark |
| 2008/0274299 A1* | 11/2008 | Chen ........ C23C 16/45502 427/569 |
| 2008/0274302 A1 | 11/2008 | Hasebe et al. |
| 2008/0299765 A1 | 12/2008 | Besling |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0163012 A1 | 6/2009 | Clark et al. |
| 2009/0183994 A1* | 7/2009 | Misra ........ C25B 1/003 205/340 |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2010/0022099 A1 | 1/2010 | Van Nooten et al. |
| 2010/0025824 A1 | 2/2010 | Chen et al. |
| 2010/0096688 A1 | 4/2010 | Balseanu et al. |
| 2010/0099236 A1 | 4/2010 | Kwon et al. |
| 2010/0102417 A1 | 4/2010 | Ganguli et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0155846 A1 | 6/2010 | Mukherjee et al. |
| 2010/0167555 A1 | 7/2010 | Maula et al. |
| 2010/0221925 A1 | 9/2010 | Lee et al. |
| 2010/0244141 A1 | 9/2010 | Beyer et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0064969 A1 | 3/2011 | Chen et al. |
| 2011/0086516 A1 | 4/2011 | Lee et al. |
| 2011/0120943 A1 | 5/2011 | Johansson et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0236594 A1 | 9/2011 | Haverkamp et al. |
| 2011/0256726 A1 | 10/2011 | LaVoie et al. |

(56) References Cited

U.S. PATENT DOCUMENTS

| | | | |
|---|---|---|---|
| 2011/0256734 A1 | 10/2011 | Hausmann et al. | |
| 2011/0298099 A1 | 12/2011 | Lee et al. | |
| 2011/0309475 A1 | 12/2011 | Lee | |
| 2012/0009802 A1 | 1/2012 | LaVoie et al. | |
| 2012/0009803 A1 | 1/2012 | Jung et al. | |
| 2012/0028454 A1 | 2/2012 | Swaminathan et al. | |
| 2012/0028469 A1 | 2/2012 | Onizawa et al. | |
| 2012/0058282 A1 | 3/2012 | Hong et al. | |
| 2012/0077349 A1 | 3/2012 | Li et al. | |
| 2012/0108079 A1 | 5/2012 | Mahajani | |
| 2012/0113672 A1 | 5/2012 | Dubrow et al. | |
| 2012/0164846 A1 | 6/2012 | Ha et al. | |
| 2012/0193693 A1 | 8/2012 | Kanaya | |
| 2012/0202356 A1* | 8/2012 | Huang | H01L 21/02186 438/785 |
| 2012/0213940 A1 | 8/2012 | Mallick | |
| 2012/0280200 A1 | 11/2012 | Tada et al. | |
| 2012/0282418 A1 | 11/2012 | Chou et al. | |
| 2012/0315394 A1 | 12/2012 | Ito | |
| 2013/0040447 A1 | 2/2013 | Swaminathan et al. | |
| 2013/0058161 A1 | 3/2013 | Yamanaka et al. | |
| 2013/0058162 A1 | 3/2013 | Yamanaka et al. | |
| 2013/0071580 A1 | 3/2013 | Weidman et al. | |
| 2013/0115783 A1 | 5/2013 | Kim et al. | |
| 2013/0189854 A1 | 7/2013 | Hausmann et al. | |
| 2013/0196516 A1 | 8/2013 | Lavoie et al. | |
| 2013/0309415 A1 | 11/2013 | Swaminathan et al. | |
| 2013/0319329 A1 | 12/2013 | Li et al. | |
| 2014/0030444 A1 | 1/2014 | Swaminathan et al. | |
| 2014/0051262 A9 | 2/2014 | Lavoie et al. | |
| 2014/0106574 A1 | 4/2014 | Kang et al. | |
| 2014/0113457 A1 | 4/2014 | Sims et al. | |
| 2014/0120270 A1 | 5/2014 | Tour et al. | |
| 2014/0120737 A1 | 5/2014 | Swaminathan et al. | |
| 2014/0134827 A1 | 5/2014 | Swaminathan et al. | |
| 2014/0141542 A1 | 5/2014 | Kang et al. | |
| 2014/0141626 A1 | 5/2014 | Hausmann et al. | |
| 2014/0182619 A1 | 7/2014 | Goto et al. | |
| 2014/0209562 A1 | 7/2014 | LaVoie et al. | |
| 2014/0216337 A1 | 8/2014 | Swaminathan et al. | |
| 2014/0264555 A1 | 9/2014 | Ahn et al. | |
| 2014/0302686 A1 | 10/2014 | Pan et al. | |
| 2014/0308812 A1 | 10/2014 | Arghavani et al. | |
| 2015/0109814 A1 | 4/2015 | Chen et al. | |
| 2015/0126042 A1 | 5/2015 | Pasquale et al. | |
| 2015/0147483 A1 | 5/2015 | Fukazawa | |
| 2015/0159271 A1 | 6/2015 | Lee et al. | |
| 2015/0170900 A1 | 6/2015 | LaVoie | |
| 2015/0206719 A1 | 7/2015 | Swaminathan et al. | |
| 2015/0235835 A1 | 8/2015 | Swaminathan et al. | |
| 2015/0243883 A1 | 8/2015 | Swaminathan et al. | |
| 2015/0247238 A1 | 9/2015 | Pasquale et al. | |
| 2015/0249013 A1 | 9/2015 | Arghavani et al. | |
| 2016/0056053 A1* | 2/2016 | Thombare | H01L 21/32053 438/664 |
| 2016/0064211 A1 | 3/2016 | Swaminathan et al. | |

FOREIGN PATENT DOCUMENTS

| | | |
|---|---|---|
| EP | 0720213 A2 * | 7/1996 |
| EP | 1 703 552 A2 | 9/2006 |
| EP | 2 278 046 | 1/2011 |
| JP | 4364320 | 8/2009 |
| JP | 2010-10497 | 1/2010 |
| KR | 10-2001-0111448 | 12/2001 |
| KR | 10-2004-0001036 | 1/2004 |
| KR | 10-2009-0057665 | 6/2009 |
| KR | 10-2009-0080019 | 7/2009 |
| KR | 10-2009-0081396 | 7/2009 |
| WO | WO 2006/026350 | 3/2006 |
| WO | WO 2006/104741 | 10/2006 |
| WO | WO 2007/118026 | 10/2007 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/112727 | 8/2013 |

OTHER PUBLICATIONS

Schuisky, Mikael, et al., "Atomic Layer Chemical Vapor Deposition of TiO2 Low Temperature Epitaxy of Rutile and Anatase". Journal of the Electrochemical Society, 147 (9) 3319-3325 (2000).*

Kukli, Kaupo, et al., "Real-Time Monitoring in Atomic Layer Deposition of TiO2 from TiI4 and H20—H2O2". Langmuir 2000, 16, 8122-8128.*

Chaukulkar, Rohan P., et al., "Atomic layer deposition of titanium dioxide using titanium tetrachloride and titanium tetraisopropoxide as precursors". J. Vac. Sci. Technol. A 31(3), May/Jun. 2013, 031509-1 to 031509-5.*

U.S. Appl. No. 14/194,549, filed Feb. 28, 2014, entitled "Capped ALD Films for Doping Fin-Shaped Channel Regions of 3-D IC Transistors."

U.S. Appl. No. 14/183,287, filed Feb. 18, 2014, entitled "High Growth Rate Process for Conformal Aluminum Nitride."

U.S. Appl. No. 14/183,287, filed Feb. 21, 2014, entitled "Plasma Assisted Atomic Layer Deposition Titanium Oxide for Conformal Encapsulation and Gap Fill Applications."

U.S. Appl. No. 14/195,653, filed Mar. 3, 2014, entitled "RF Cycle Purging to Reduce Surface Roughness in Metal Oxide and Metal Nitride Films."

U.S. Appl. No. 14/194,324, filed Feb. 28, 2014, entitled "Soft Landing Nanolaminates for Advanced Patterning."

U.S. Appl. No. 14/464,462, filed Aug. 20, 2014, entitled "Method and Apparatus to Deposit Pure Titanium Thin Film at Low Temperature Using Titanium Tetraiodide Precursor."

U.S. Appl. No. 14/335,785, filed Jul. 18, 2014, entitled "Methods for Depositing Silicon Oxide."

U.S. Appl. No. 14/552,011, filed Nov. 24, 2014, entitled "Selective Inhibition in Atomic Layer Deposition of Silicon-Containing Films."

U.S. Appl. No. 14/678,736, filed Apr. 3, 2015, entitled "Deposition of Conformal Films by Atomic Layer Deposition and Atomic Layer Etch."

U.S. Appl. No. 12/154,984, filed May 28, 2008, entitled "Methods and Apparatus for Depositing Titanium Based Diffusion Barrier Films."

U.S. Appl. No. 14/607,997, filed Jan. 28, 2015, entitled "Plasma Activated Conformal Dielectric Film Deposition".

US Office Action, dated Jul. 31, 2002, issued in U.S. Appl. No. 09/862,539.

US Office Action, dated Jun. 15, 2004, issued in U.S. Appl. No. 10/289,237.

US Notice of Allowance, dated Sep. 3, 2004, issued in U.S. Appl. No. 10/289,237.

US Office Action, dated Sep. 2, 2009, issued in U.S. Appl. No. 12/002,780.

US Notice of Allowance, dated Jan. 27, 2010, issued in U.S. Appl. No. 12/002,780.

US Office Action, dated Oct. 6, 2009, issued in U.S. Appl. No. 12/154,984.

US Final Office Action, dated Apr. 15, 2010, issued in U.S. Appl. No. 12/154,984.

US Office Action dated Mar. 15, 2013 issued in U.S. Appl. No. 13/084,399.

US Final Office Action dated Sep. 13, 2013 issued in U.S. Appl. No. 13/084,399.

US Notice of Allowance dated Jan. 15, 2014 issued in U.S. Appl. No. 13/084,399.

US Office Action dated Jan. 2, 2015 issued in U.S. Appl. No. 14/231,554.

US Final Office Action dated Jun. 10, 2015 issued in U.S. Appl. No. 14/231,554.

(56) References Cited

OTHER PUBLICATIONS

US Office Action dated Sep. 14, 2012 issued in U.S. Appl. No. 13/084,305.
US Final Office Action dated Apr. 25, 2013 issued in U.S. Appl. No. 13/084,305.
US Office Action dated Apr. 13, 2011 issued in U.S. Appl. No. 12/889,132.
US Notice of Allowance dated Sep. 30, 2011 issued in U.S. Appl. No. 12/889,132.
US Office Action dated Aug. 1, 2012 issued in U.S. Appl. No. 13/011,569.
US Final Office Action dated Feb. 26, 2013 issued in U.S. Appl. No. 13/011,569.
US Notice of Allowance dated May 6, 2013 issued in U.S. Appl. No. 13/011,569.
US Office Action dated Apr. 4, 2013 issued U.S. Appl. No. 13/242,084.
US Notice of Allowance dated Jun. 19, 2013 issued U.S. Appl. No. 13/242,084.
US Notice of Allowance dated Sep. 19, 2013 issued U.S. Appl. No. 13/242,084.
US Notice of Allowance dated Aug. 7, 2014 issued U.S. Appl. No. 14/133,239.
US Notice of Allowance dated Nov. 26, 2014 issued U.S. Appl. No. 14/113,239.
US Office Action dated Apr. 29, 2013 issued U.S. Appl. No. 13/224,240.
US Final Office Action dated Nov. 22, 2013 issued U.S. Appl. No. 13/224,240.
US Examiner's Answer to a Appeal Brief (filed May 22, 2014) Before the Patent Trial and Appeal Board dated Aug. 14, 2014 issued U.S. Appl. No. 13/224,240.
US Office Action dated Jun. 7, 2013 issued U.S. Appl. No. 13/414,619.
US Notice of Allowance dated Jul. 26, 2013 issued U.S. Appl. No. 13/414,619.
US Office Action dated May 24, 2013 issued U.S. Appl. No. 13/472,282.
US Notice of Allowance dated Oct. 4, 2013 issued U.S. Appl. No. 13/472,282.
US Office Action dated May 21, 2014 issued in U.S. Appl. No. 13/607,386.
US Notice of Allowance dated Oct. 8, 2014 issued in U.S. Appl. No. 13/607,386.
US Notice of Allowance dated Nov. 19, 2014 issued in U.S. Appl. No. 13/607,386.
US Office Action dated Jun. 13, 2014 issued in U.S. Appl. No. 13/953,616.
US Final Office Action dated Nov. 24, 2014 issued in U.S. Appl. No. 13/953,616.
US Office Action dated Dec. 11, 2014 issued in U.S. Appl. No. 14/074,596.
US Office Action dated May 15, 2015 issued in U.S. Appl. No. 14/074,617.
US Office Action dated May 30, 2014 issued in U.S. Appl. No. 13/862,048.
US Final Office Action dated Oct. 16, 2014 issued in U.S. Appl. No. 13/862,048.
US Notice of Allowance dated Apr. 28, 2015 issued in U.S. Appl. No. 13/862,048.
US Notice of Allowance and Corrected Notice of Allowability dated Jun. 17, 2015 issued in U.S. Appl. No. 13/862,048.
US Notice of Allowance [Corrected] dated Jul. 17, 2015 issued in U.S. Appl. No. 13/862,048.
US Office Action dated Mar. 2, 2015 issued in U.S. Appl. No. 14/137,860.
US Office Action dated Jul. 10, 2014 issued in U.S. Appl. No. 14/144,107.
US Final Office Action dated Jan. 15, 2015 issued in U.S. Appl. No. 14/144,107.
US Notice of Allowance dated Mar. 19, 2015 issued in U.S. Appl. No. 14/144,107.
US Office Action dated Jul. 2, 2015 issued in U.S. Appl. No. 14/187,145.
US Office Action dated Jul. 16, 2015 issued in U.S. Appl. No. 14/464,462.
US Office Action dated Apr. 13, 2015 issued in U.S. Appl. No. 14/335,785.
PCT International Search Report and Written Opinion, dated Oct. 20, 2011, issued in PCT/US2011/032186.
PCT International Preliminary Report on Patentability, dated Oct. 26, 2012, issued in PCT/US2011/032186.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
Chinese First Office Action [no translation] dated Jun. 2, 2015 issued in CN 201180045808.6.
PCT International Search Report and Written Opinion dated Dec. 18, 2012, issued in Application No. PCT/US2012/052769.
PCT International Preliminary Report on Patentability and Written Opinion dated Apr. 3, 2014, issued in Application No. PCT/US2012/052769.
PCT International Search Report and Written Opinion dated Feb. 28, 2013, issued in Application No. PCT/US2012/051740.
PCT International Preliminary Report on Patentability and Written Opinion dated Mar. 13, 2014, issued in Application No. PCT/US2012/051740.
European Extended Search Report dated Apr. 14, 2014 issued in EP 13 15 2046.
Korean Notice of Provisional Rejection dated Dec. 6, 2013 issued in KR 10-2012-0043797.
Korean Final Office Action dated Aug. 18, 2014 issued in KR 10-2012-0043797.
Korean Trial Decision (English description) dated May 25, 2015 issued in KR 10-2012-0043797.
PCT International Search Report and Written Opinion dated May 27, 2013, issued in Application No. PCT/US2013/022977.
PCT International Preliminary Report on Patentability and Written Opinion dated Aug. 7, 2014, issued in Application No. PCT/US2013/022977.
Abe et al. (2000) "Effect of Ti insertion between Cu and TiN Layers on electromigration reliability in Cu/(Ti)/TiN/Ti layered damascene interconnects", *IEEE* 00CH37059. $38^{th}$ Annual International Reliability Physics Symposium, San Jose, California, pp. 333-338.
Cecchi et al., (2007) "Ultra-thin conformal pore-sealing of low-k materials by plasma-assisted ALD," *University of New Mexico, Albuquerque, NM, Sandia National Labs*, Albuquerque, NM, 1 page.
Chen et al. (Jan./Feb. 1999) "Low Temperature Plasma-Assisted Chemical Vapor Deposition of Tantalum Nitride form Tantalum Pentabromide for Copper Metallization," *J. Vac. Sci. Technol.*, B 17(1):182-185.
Cheng et al. (Mar./Apr. 1995) "Directional Deposition of Cu into Semiconductor Trench Structures Using Ionized Magnetron Sputtering," *J. Vac. Sci. Technol.*, B 13(2):203-208.
Cho el al. (Dec. 1998) "Remote Plasma-Assisted Metal Organic Chemical Vapor Deposition of Tantalum Nitride Thin Films with Different Radicals," *Japanese Journal of Appl. Phys.*, 37(Part 1)(12A):6502-6505.
Choi, Gyu-Jin et al., (2009) "Plasma-enhanced atomic layer deposition of $TiO_2$ Al-doped $TiO_2$ films using $N_2O$ and $O_2$ reactants," *Journal of the Electrochemical Society*, 156(9):G138-G143.

(56) References Cited

OTHER PUBLICATIONS

D'Couto et al. (2001) "In situ physical vapor deposition of ionized Ti and TiN thin films using hollow cathode magnetron plasma source," *J.Vac.Sci.Technol. B*. 19(1):244-249.

Elam, J.W. (2003) Surface chemistry and film growth TiN atomic layer deposition using TDMAT and $NH^3$, *Elsevier Science B.V.*, 436:145-156.

Endle et al. (May/Jun. 1998) "X-Ray Photoelectron Spectroscopy Study on TiN Films Produced with Terakis (dimethylamido)Titanium and Selected N-Containing Precursors on $SiO_2$," *J. Vac. Sci. Technol.*, A 16(3):1262-1267.

Green et al. (Dec. 1997) "Determination of Flux Ionization Fraction Using a Quartz Crystal Microbalance and a Gridded Energy Analyzer in an Ionized Magnetron Sputtering System," *Rev. Sci. Instrum.*, 68(12):4555-4560.

Han et al. (May 1998) "Barrier Metal Properties of Amorphous Tantalum Nitride Thin Films Between Platnium and Silicon Deposited Using Remote Plasma Metal Organic Chemical Vapor Method," *Jpn. J. Appl. Phys.*, 37 Part 1(5A):2646-2651.

Hausmann et al. (2002) "Atomic Layer Deposition of Hafnium and Zirconium Oxides Using Metal Amide Precursors," *Chem. Mater.* 14(10):4350-4358.

Hayden et al. (1999) "Helion Plasma Source for Ionized Physical Vapor Deposition," 1999, *Surface and Coatings Technology*, pp. 120-121, pp. 401-404.

Hayden et al. (Mar./Apr. 1998) "Characterization of Magnetron-Sputtered Partially Ionized Aluminum Deposition," *J. Vac. Sci. Technol.*, A 16(2):624-627.

Kim, H., et al., (2002) "The Growth of Tantalum Thin Films by Plasma-Enhanced Atomic Layer Depostion and Diffusion Barrier Properties," *Mat. Res. Soc. Symp. Proc.* 716:B8.5.1-B8.5.6.

King, Sean W., (Jul./Aug. 2011) "Plasma enhanced atomic layer deposition on $SiN_x$:H and $SiO_2$," *J. Vac. Sci. Technol.* A29(4):041501-1 through 041501-9 (9 pages).

Klawuhn et al. (Jul./Aug. 2000) "Ionized Physical-vapor deposition Using a Hollow-Cathode Magnetron Source for Advanced Metallization," *J. Vac. Sci. Technol.* A, 18(4):1546-1549.

Ko, Myoung-Gyun, et al., "Characterization of ruthenium thin film deposited by rf-direct plasma atomic layer depostion," *209th ECS Meeting*, Abstract #50, p. 1 [Downloaded on Jun. 9, 2014].

Ko, Myoung-Gyun, et al., (Oct. 2008) "Correlation of Carbon Content with the Thermal Stability of Ruthenium Deposited by Using RF-Direct Plasma-Enhanced Atomic-Layer Depostion," *Journal of the Korean Physical Society*, 53(4):2123-2128.

Lee et al. (1996) "The Failure Mechanism of MOCVD TiN Diffusion Barrier at High Temperature," *Mat. Res. Soc. Symp. Proc.*, 324:279-284.

Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronics Engineering* 80:158-161.

Lee, Jong Ju (2005) "Low-impurity, highly conformal atomic layer deposition of titanium nitride using $NH_3$—Ar—$H_2$ plasma treatment for capacitor electrodes," *Materials Letters*, 59:615-617.

Li, Xingcun et al., (2011) "Atomic Layer Deposition $Al_2O_3$ Thin Films in Magnetized Radio Frequency Plasma Source," *Physics Procedia* 18:100-106.

Lucovsky, Gerald et al. (1990) "Formation of Thin Films by Remote Plasma Enhanced Chemical Vapor Deposition (Remote PECVD)" in *Handbook of Plasma Processing Technology*, eds. Rossnagel, Cuomo and Westwood, Noyes Publications, pp. 387-408.

Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.

Manik P. et al. (2012) Fermi-level unpinning and low resistivity in contacts to n-type Ge with ZnO interfacial layer, *App. Phys. Lett.* 101:182105-1-182105-5.

Musher et al. (Feb. 1996) "Atmospheric Pressure Chemical Vapor Deposition of Titanium Nitride from Tetrakis (diethylamido) Titanium and Ammonia," *J. Electochem. Soc.*, 143(2):736-744.

Nguyen S.V. et al., (Jan./Mar. 1999) "Plasma-assist chemical vapor deposition of dielectric thin films for ULSI semiconductor circuits,"*IBM J.Res.Develop.* 43(1.2):5-38.

Peng et al. (Jul./Aug. 1998) "Structural and Electrical Properties of Chemical Vapor Deposition Tungsten Overgrowth on Physical Vapor Deposited and Metalorganic Chemical Vapor Deposited TiN Adhesion Layers," *J. Vac. Sci. Technol., B* 16(4):2013-2018.

Plasma Enhanced Atomic Layer Deposition (PEALD), Website: http://www.asm.com/index.php?option=com_content&task=view&id=19&Itemid=161 (2010), 1 page.

"PlasmaPro™ NGP® 80 Range," *Oxford Instruments* (2010), 8 pages.

Puurunen, Riikka L. (2005) "Surface chemistry of atomic layer deposition: A case study for the trimethylaluminum/water process," *Journal of Applied Physics*, 97:121301-1-121301-52.

Reif et al. (Feb. 1990) "Plasma Enhanced Chemical Vapor Deposition of Thin Films for Microelectronics," *Handbook of Plasma Processing Technology*, eds: Rossnagel, Cuomo and Westwood, Noyes Publications, pp. 260-284.

Schumacher Products, TDEAT (Tetrakis—diethylamino Titanium), Electronic Grade, www.schumacher.com/tdeat.html, printed Jun. 5, 2001, 1 page.

Truong et al. (1995) "Low Pressure Deposition of TiN Thin Films from a Terakis (diethylamido) Titanium Precursor," *J. Phys. Chem*, 99:8831-8842.

Tsai et al. (May 1996) "Comparison of the Diffusion Barrier Properties of Chemical-Vapor-Deposited TaN and Sputtered TaN Between Cu and Si," *J. Appl. Phys.*, 79(9):6932-6938.

Ueki et al. (2004) "Effects of Ti Addition on Via Reliability in Cu Dual Damascene Interconnects," *IEEE Transactions on Electron Devices*, 51(11):1883-1891.

van der Straten et al. (2004) "Atomic layer deposition of tantalum nitride for ultrathin liner applications in advanced copper metallization schemes," *Journal of Materials Research*, 19(2):447-453.

Wu et al. (2008) "Ti-based Barrier for Cu Interconnect Applications", *International Interconnect Technology Conference paper on June 1*, 3 pp.

Zhong et al. (Mar./Apr. 1999) "Ionized Titanium Deposition into High tAspect Ratio Vias and Trenches", American Vacuum Society, *J. Vac. Sci. Technol. B* 17(2):405-409.

US Notice of Allowance dated Aug. 31, 2015 issued in U.S. Appl. No. 14/231,554.

US Office Action dated Sep. 21, 2015 issued U.S. Appl. No. 14/607,997.

US Office Action dated Aug. 14, 2015 issued in U.S. Appl. No. 14/061,587.

US Notice of Allowance dated Oct. 1, 2015 issued U.S. Appl. No. 14/137,860.

US Notice of Allowance [Supplemental Notice of Allowability] dated Oct. 22, 2015 issued in U.S. Appl. No. 14/137,860.

US Office Action dated Oct. 21, 2015 issued in U.S. Appl. No. 14/194,549.

US Notice of Allowance dated Aug. 5, 2015 issued in U.S. Appl. No. 14/183,287.

US Ex Parte Quayle Action dated Oct. 8, 2015 issued in U.S. Appl. No. 14/194,324.

US Notice of Allowance dated Mar. 9, 2016 issued in U.S. Appl. No. 14/194,324.

US Notice of Allowance dated Feb. 12, 2016 issued in U.S. Appl. No. 14/464,462.

Lavareda et al., (2004) "Properties of a-Si:H TFTs using silicon carbonitride as dielectric," Journal of Non-Crystalline Solids, 338-340:797-801.

\* cited by examiner

METHOD TO TUNE TIO$_x$ STOICHIOMETRY USING ATOMIC LAYER DEPOSITED TI FILM TO MINIMIZE CONTACT RESISTANCE FOR TIO$_x$/TI BASED MIS CONTACT SCHEME FOR CMOS

BACKGROUND

Conventionally, complementary metal-oxide-semiconductor contact schemes are used in semiconductor fabrication. As semiconductor devices scale to smaller and smaller technology nodes, shrinking feature dimensions make deposition of low resistance materials more challenging. Semiconductor manufacturing processes often involve deposition of titanium or titanium-containing compounds in forming alternate contact schemes. Increasing aspect ratios can lead to incomplete step coverage on feature surfaces, resulting in poor barrier performance in semiconductor devices.

SUMMARY

Provided herein are methods of forming titanium oxide on a semiconductor substrate. Methods may be performed in a chamber. One aspect involves (a) depositing titanium on the substrate, such that depositing titanium includes: (i) exposing the substrate to titanium tetraiodide, (ii) purging the chamber, (iii) exposing the substrate to an ignited plasma, and (iv) purging the chamber, and (v) repeating (i) through (iv) until the desired thickness of titanium is deposited; and (b) treating the substrate to form sub-stoichiometric titanium oxide. The plasma may be generated remotely or in the chamber. In various embodiments, the substrate includes silicon oxide. In some embodiments, the substrate includes features.

In various embodiments, the sub-stoichiometric titanium oxide includes titanium oxide having the chemical formula TiO$_x$, where x<2. In some embodiments, the titanium is deposited at a temperature less than about 400° C.

In some embodiments, the method involves, prior to depositing the titanium, depositing a layer of titanium oxide on the substrate. The layer of titanium oxide may be formed by exposing the substrate to a titanium-containing precursor.

In various embodiments, treating the substrate includes exposing the substrate to the titanium-containing precursor and an oxidant. The oxidant may be selected from the group consisting of oxygen, nitrous oxide, water vapor, hydrogen peroxide, and ozone. In some embodiments, treating the substrate includes annealing the substrate, such as by heating the substrate to a temperature between about 300° C. and about 450° C.

In some embodiments, the sub-stoichiometric titanium oxide is deposited to a thickness between about 10 Å to about 50 Å. The method may further include prior to depositing the titanium, pre-cleaning the substrate. In some embodiments, the substrate is exposed to a carrier gas throughout (i) through (v).

In some embodiments, the substrate is exposed to titanium tetraiodide in (i) for a duration between about 1 second and about 30 seconds, the substrate is purged in (ii) and (iv) each for a duration between about 1 second and about 5 seconds, and the substrate is exposed to hydrogen and plasma in (iii) for a duration between about 1 second and about 10 seconds.

Another aspect involves an apparatus for processing a semiconductor substrate, which includes a reaction chamber including a pedestal for holding the substrate; at least one outlet for coupling to a vacuum; one or more process gas inlets coupled to one or more precursor sources; a radio frequency (RF) generator; and a controller for controlling operations in the apparatus, including machine-readable instructions for: (a) introducing a titanium-containing precursor to the chamber; (b) purging the chamber; (c) providing a plasma in the chamber; and (d) purging the chamber; (e) repeating (b) through (d); and (f) treating the substrate to form sub-stoichiometric titanium oxide.

In some embodiments, the controller further includes machine-readable instructions for heating the substrate to a temperature between about 300° C. and about 450° C. In some embodiments, the controller further includes machine-readable instructions for introducing an oxidant to the chamber while providing a plasma in the chamber.

These and other aspects are described further below with reference to the drawings.

DETAILED DESCRIPTION

Figure 1:
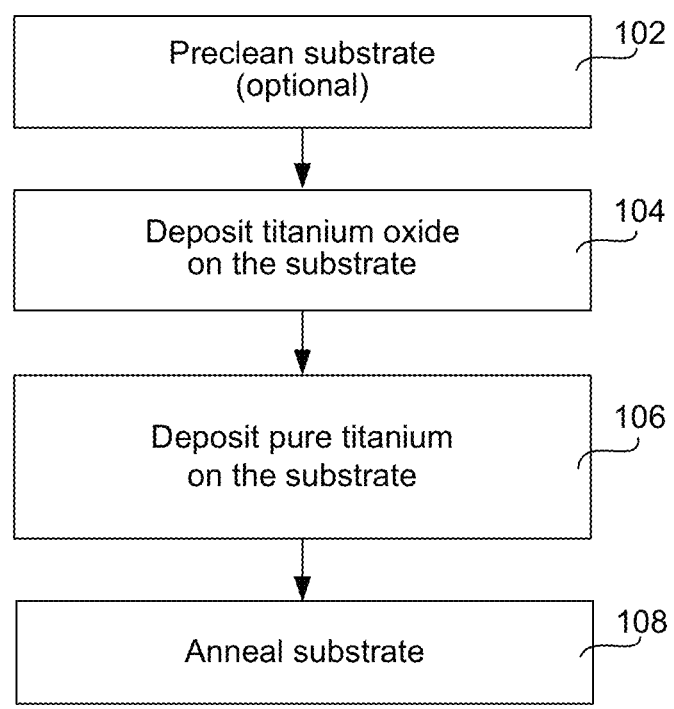
FIG. 1 is a process flow diagram illustrating operations in a method of depositing titanium oxide in accordance with various embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Complementary metal-oxide-semiconductor (CMOS) technology has been used to fabricate integrated circuits. As devices shrink, high contact resistance between the metal and semiconductor source/drain regions causes high energy consumption in the device. One alternative to CMOS contact schemes is a semiconductor-metal scheme. Conventional semiconductor-metal contact schemes include silicon/ titanium silicide (Si/TiSi$_2$) and nickel silicide/titanium/titanium nitride/tungsten (NiSi/Ti/TiN/W) schemes. However, the contact resistance between the metal and the semiconductor source/drain region may dominate the net parasitic resistance. Reduced contact resistance minimizes energy consumption and alleviates heating problems in the semiconductor device.

An alternative MIS metal-insulator-semiconductor (MIS) contact scheme architecture has been proposed to minimize contact resistance. In an MIS scheme, an insulator is deposited between the metal and semiconductor material. Such architecture mitigates the Fermi level pinning and introduces a layer of a large-bandgap material between the metal and semiconductor. When a metal is electrically in contact with a semiconductor, the work required to go from the metal Fermi level to the carrier band edge of the semiconductor can be described as the Schottky barrier height $\Phi_B$. The Schottky barrier height $\Phi_B$ is directly proportional with the contact resistance at the metal-semiconductor interface. $E_F$ represents the Fermi level, $E_C$ represents the conduction band minimum of the semiconductor, and $E_V$ represents the valence band maximum of the semiconductor. In a metal, the Fermi level is at the top of the metal's valence band. The work required to remove an electron from the metal Fermi level to the surface of the metal is the metal work function $\Phi_M$. In a semiconductor, the Fermi level is positioned in the band gap between $E_C$ and $E_V$ depending on the doping. In an n-doped semiconductor, the semiconductor Fermi level is typically positioned closer to the semiconductor conduction band $E_C$. In a p-doped semiconductor, the semiconductor Fermi level is typically positioned closer to the semiconductor valence band $E_V$. Generally, when a metal comes in contact with a semiconductor, the Fermi levels for the metal and semiconductor arrive at equilibrium such that a Fermi level is "pinned" in the band gap of the semiconductor. In an MIS contact scheme, the insulator between the metal and semiconductor layers reduces the Fermi level pinning effect. MIS contacts reduce the effective barrier height $\Phi_B$, but an insulating layer adds a tunneling resistance. Titanium oxide is one suitable insulator for use in a MIS contact scheme due to its low conduction band off-set, which can counter the tunneling resistance.

Provided herein are methods of depositing tunable titanium oxide films on semiconductor substrates to form a MIS contact scheme including titanium oxide between a metal layer and a semiconductor layer. Methods involve depositing sub-stoichiometric titanium oxide (TiO$_x$) by reacting titanium with the semiconductor's native oxide layer, post-treating a layer of deposited titanium, or oxidizing a layer of deposited titanium. Titanium layers as deposited herein are highly conformal layers having less than about 1% contamination, or less than about 0.1% contamination. In some embodiments, these highly conformal and pure layers of titanium are deposited using methods and apparatuses as described in U.S. patent application Ser. No. 14/464,462, filed on Aug. 20, 2014, titled "METHOD AND APPARATUS TO DEPOSIT PURE TITANIUM THIN FILM AT LOW TEMPERATURE USING TITANIUM TETRAIODIDE PRECURSOR," which is herein incorporated by reference in its entirety.

By using the methods described herein, the stoichiometry of titanium oxide may be tuned to minimize contact resistance. Sub-stoichiometric titanium oxide exhibits lower resistance than titanium oxide (TiO$_2$). Sub-stoichiometric titanium oxide is defined as titanium oxide having the chemical formula TiO$_x$, where x<2. In some embodiments, sub-stoichiometric titanium oxide has a chemical formula TiO$_{1.8}$, or TiO$_{1.5}$, or TiO$_{0.6}$. In some embodiments, the stoichiometry is tuned by varying thickness of films deposited, film treatment, and/or oxidant exposure. Processes may be performed in a single platform, which reduces cost of fabricating such devices. Films are also deposited at a low temperature so as not to exceed a thermal budget. Deposited films also exhibit high step coverage. Such films may be used for front end of line (FEOL) applications.

FIG. 1 provides a process flow diagram depicting a method of depositing sub-stoichiometric titanium oxide to minimize contact resistance. A substrate is provided to a process chamber. The substrate may be a silicon wafer, e.g., a 200-mm wafer, a 300-mm wafer, or a 450-mm wafer, including wafers having one or more layers of material such as dielectric, conducting, or semi-conducting material deposited thereon. The substrate may include one or more features. For example, a feature may be formed at least partially in a dielectric layer. In some embodiments, the feature may have an aspect ratio of at least about 2:1, at least about 4:1, at least about 6:1, at least about 10:1, or higher. The feature may also have a dimension near the opening, e.g., an opening diameter or line width of between about 10 nm to 500 nm, for example between about 25 nm and about 300 nm.

In operation 102, the substrate is optionally precleaned. A preclean process may be heat treatment, plasma treatment (for example, with Ar or reactive F or Cl-based chemistry) for a time up to about 2 minutes, or any other suitable precleaning treatment. In some embodiments, a preclean is performed in a chamber separate from the deposition chamber, and the substrate is transferred to the deposition chamber after operation 102. In some embodiments, an optional silicon oxide layer is deposited after the substrate is precleaned by exposing the silicon substrate to an oxidant, such as oxygen (O$_2$), water (H$_2$O) such as water vapor, ozone (O$_3$), nitrous oxide (N$_2$O), or hydrogen peroxide (H$_2$O$_2$).

In operation 104, titanium oxide is deposited on the substrate. In some embodiments, the substrate is exposed to a titanium-containing precursor and an oxidant, which react to form titanium oxide on the substrate. In various embodiments, the titanium-containing precursor is titanium tetraiodide. In some embodiments, the titanium-containing precursor is a metal-organic titanium precursor, such as TDMAT, TEMAT, or TDEAT. In some embodiments, titanium chloride is used as a precursor. Oxidants include oxygen (O$_2$), water (H$_2$O) such as water vapor, ozone (O$_3$), nitrous oxide (N$_2$O), hydrogen peroxide (H$_2$O$_2$), and other suitable oxidants. The precursor and oxidant may be introduced separately or together, diluted with an inert carrier gas, such as argon or nitrogen. The titanium oxide layer may be deposited by ALD, plasma enhanced ALD (PEALD), or conformal film deposition (CFD) methods. ALD processes use surface-mediated deposition reactions to deposit films on a layer-by-layer basis. In one example ALD process, a substrate surface, including a population of surface active sites, is exposed to a gas phase distribution of a first film precursor (P1), such as a titanium-containing precursor. Some molecules of P1 may form a condensed phase atop the substrate surface. The reactor is then evacuated to remove gas phase P1 so that only adsorbed species remain. A second film precursor (P2), such as an oxidant, is then introduced to the reactor so that some molecules of P2 adsorb to the substrate surface. The reactor may again be evacuated, this time to remove unbound P2. Subsequently, thermal energy provided to the substrate activates surface reactions between adsorbed molecules of P1 and P2, forming a film layer. Finally, the reactor is evacuated to remove reaction by-products and possibly unreacted P1 and P2, ending the ALD cycle. Additional ALD cycles may be included to build film thickness. In an example of a PEALD process, a plasma is initiated while the second film precursor P2 is introduced to the reactor to activate the reaction between P1 and P2.

CFD may be used to deposit titanium oxide. Generally, CFD does not rely on complete purges of one or more reactants prior to reaction to form the spacer 109. For example, there may be one or more reactants present in the vapor phase when a plasma (or other activation energy) is struck. Accordingly, one or more of the process steps described in an ALD process may be shortened or eliminated in an example CFD process. Further, in some embodiments, plasma activation of deposition reactions may result in lower deposition temperatures than thermally-activated reactions, potentially reducing the thermal budget of an integrated process. For context, a short description of CFD is provided. The concept of a CFD "cycle" is relevant to the discussion of various embodiments herein. Generally a "cycle" is the minimum set of operations used to perform a surface deposition reaction one time. The result of one cycle is production of at least a partial film layer on a substrate surface. Typically, a CFD cycle will include only those steps necessary to deliver and adsorb each reactant to the substrate surface, and then react those adsorbed reactants to form the partial layer of film. Of course, the cycle may include certain ancillary steps such as sweeping one or more of the reactants or byproducts and/or treating the partial film as deposited. Generally, a cycle contains only one instance of a unique sequence of operations. As an example, a cycle may include the following operations: (i) delivery/adsorption of reactant A, (ii) delivery/adsorption of reactant B, (iii) sweep B out of the reaction chamber, and (iv) apply plasma to drive a surface reaction of A and B to form the partial film layer on the surface.

The following conditions are examples of conditions suitable depositing a titanium oxide by a CFD process. Deposition may occur at a temperature between about 50° C. and about 400° C., at a pressure between about 0.5 Torr and about 10 Torr, and an RF power for four 300 mm stations between about 100 W and about 2500 W. Process gas flow rates may be as follows: for a titanium-containing precursor (TDMAT), between about 0.2 sccm and about 2.0 sccm; for oxygen precursor or oxidant ($O_2$, $N_2O$), between about 5000 sccm and 10,000 sccm, for example $N_2O$ at 5000 sccm; and for the carrier gas (Ar or $N_2$), between about 0 and 10,000 sccm, for example about 5000 sccm Ar.

In operation 106, titanium is deposited on the substrate. In various embodiments, highly conformal and highly pure titanium is deposited by ALD. The level of contamination in the titanium layer may be less than about 1%, for example about 0.1%. The thickness of the titanium film deposited may be tuned depending on the desired ratio of titanium to oxygen in the resulting sub-stoichiometric titanium oxide layer and may also depend on the thickness of the titanium oxide layer deposited in operation 104.

Figure 2:
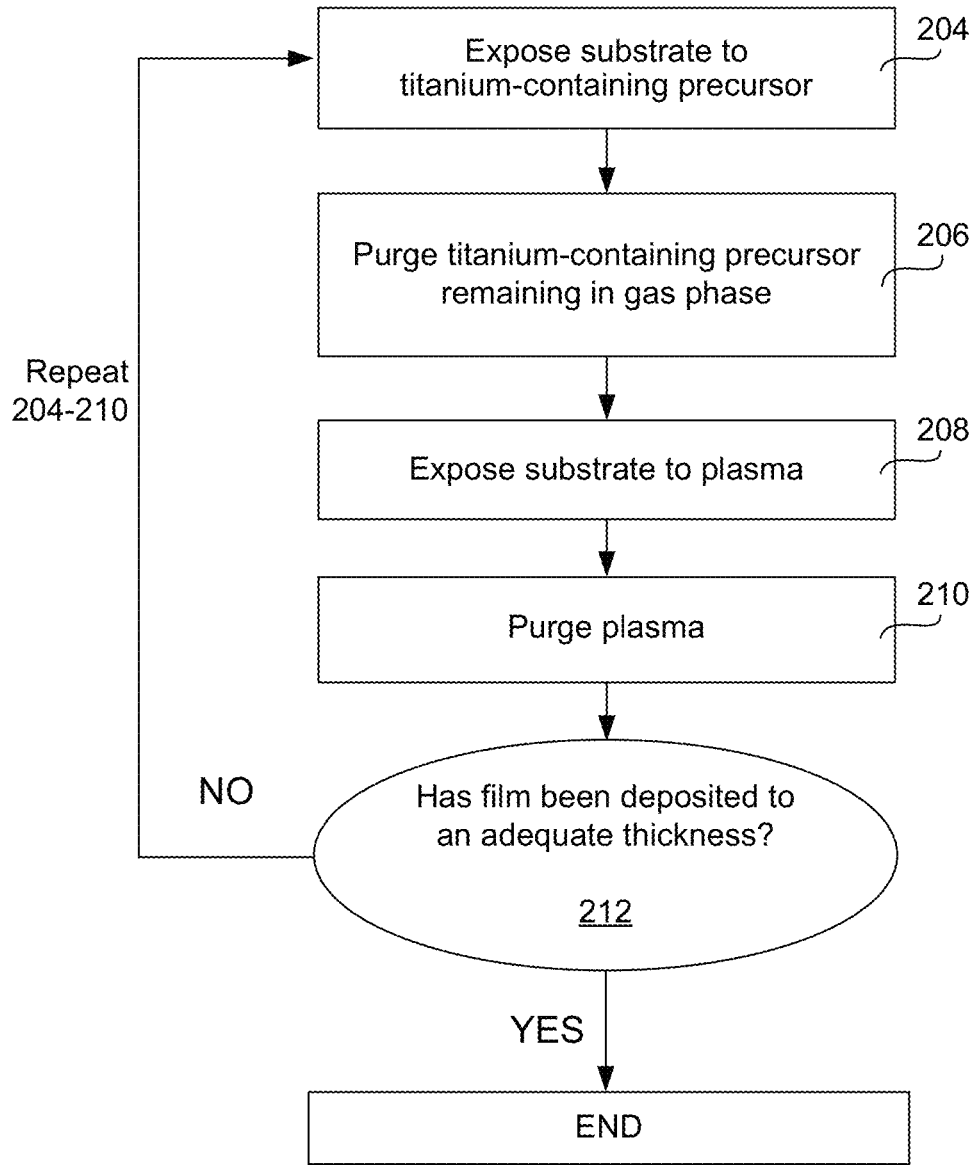
FIG. 2 is a process flow diagram illustrating operations in a method of depositing titanium in accordance with various embodiments.

FIG. 2 provides a process flow diagram of operations for performing a method in accordance with disclosed embodiments. The operations of FIG. 2 may be performed at a temperature less than about 450° C. In various embodiments, the temperature of a chamber where the operations of FIG. 2 are performed is less than about 350° C. The pressure of the chamber may be between about 0.1 Torr and about 20 Torr, or between about 1 Torr and about 3 Torr. A carrier gas may flow during the operations in FIG. 2. The carrier gas may be any inert gas such as argon, which may flow at a flow rate between about 100 sccm and about 300 sccm. Gases such as argon are particularly suitable for deposition of highly pure titanium films. In embodiments where a titanium compound is to be deposited on a substrate, a secondary gas may be used in conjunction with the carrier gas or instead of the carrier gas, such as nitrogen ($N_2$), or a nitrogen-containing gas, for deposition of TiN.

In operation 204, the substrate is exposed to a titanium-containing precursor such $TiI_4$. The titanium-containing precursor is adsorbed onto active sites on the substrate surface. In some embodiments, the substrate is exposed for a duration sufficient to cover substantially all of the active sites, such as at least about 80%, or at least about 90% of the active sites. In various embodiments, the substrate is exposed to a titanium-containing precursor for a time between about 1 second and about 30 seconds.

Examples of titanium-containing precursors include compounds having the formula $TiX_n$, where n is an integer between and including 2 through 4, and X is a halide. Specific examples include $TiI_4$, $TiCl_4$, $TiF_4$, and $TiBr_4$. In various embodiments, the substrate is exposed to $TiI_4$. In some embodiments, the titanium-containing precursor is a non-organic compound. The titanium-containing precursor may be stored in a bubbler upstream of the deposition chamber. The bubbler may be set at a temperature between about 80° C. and about 160° C., or less than about 100° C.

Operation 204 may be performed with or without a plasma. If a plasma is used, the plasma may be a remote or in-situ plasma. The plasma may have a frequency of between about 13.56 MHz and about 27 MHz. In some embodiments, the plasma has a frequency of 27 MHz. The power of the plasma may be between about 0.3 W/cm² and about 0.6 W/cm².

In operation 206, the chamber is purged of any remaining titanium-containing precursor left in gas phase. As such, the flow of the titanium-containing precursor is stopped, and the carrier gas is continuously flowing into the chamber during this operation. This operation may be performed for a time between about 1 second and about 5 seconds.

In operation 208, the substrate is exposed to a plasma. Any inert gas may be flowed during this operation, such as argon or $H_2$. In some embodiments, a mixture of argon and $H_2$ are flowed while the plasma is ignited. The plasma may be either a remote or in-situ plasma and may have any of the frequencies and powers described above with respect to operation 204. In many embodiments, this plasma dose may be performed for a duration between about 1 second and about 10 seconds. During this operation, bonds between titanium and any ligands, such as an iodine atom, may be broken such that solid and substantially pure (less than about 1% contamination) titanium remains on the substrate.

In operation 210, the plasma is turned off and the chamber is purged such that only the carrier gas, which has been continuously flowing throughout operations 204 and 208, continues to flow into the chamber. This purge may be performed for a duration between about 1 second and about 5 seconds. During this operation, any compounds formed from the ligands removed during operation 208 may be purged. For example, iodine ($I_2$) may be removed during this operation. The plasma may be an in situ plasma or a remote plasma.

In operation 212, it is determined whether the deposited film has been deposited to an adequate thickness, which may be any suitable thickness desired for the deposition of the pure and highly conformal titanium. If not, then operations 204-210 are repeated until the film is deposited to an adequate thickness.

Figure 3:
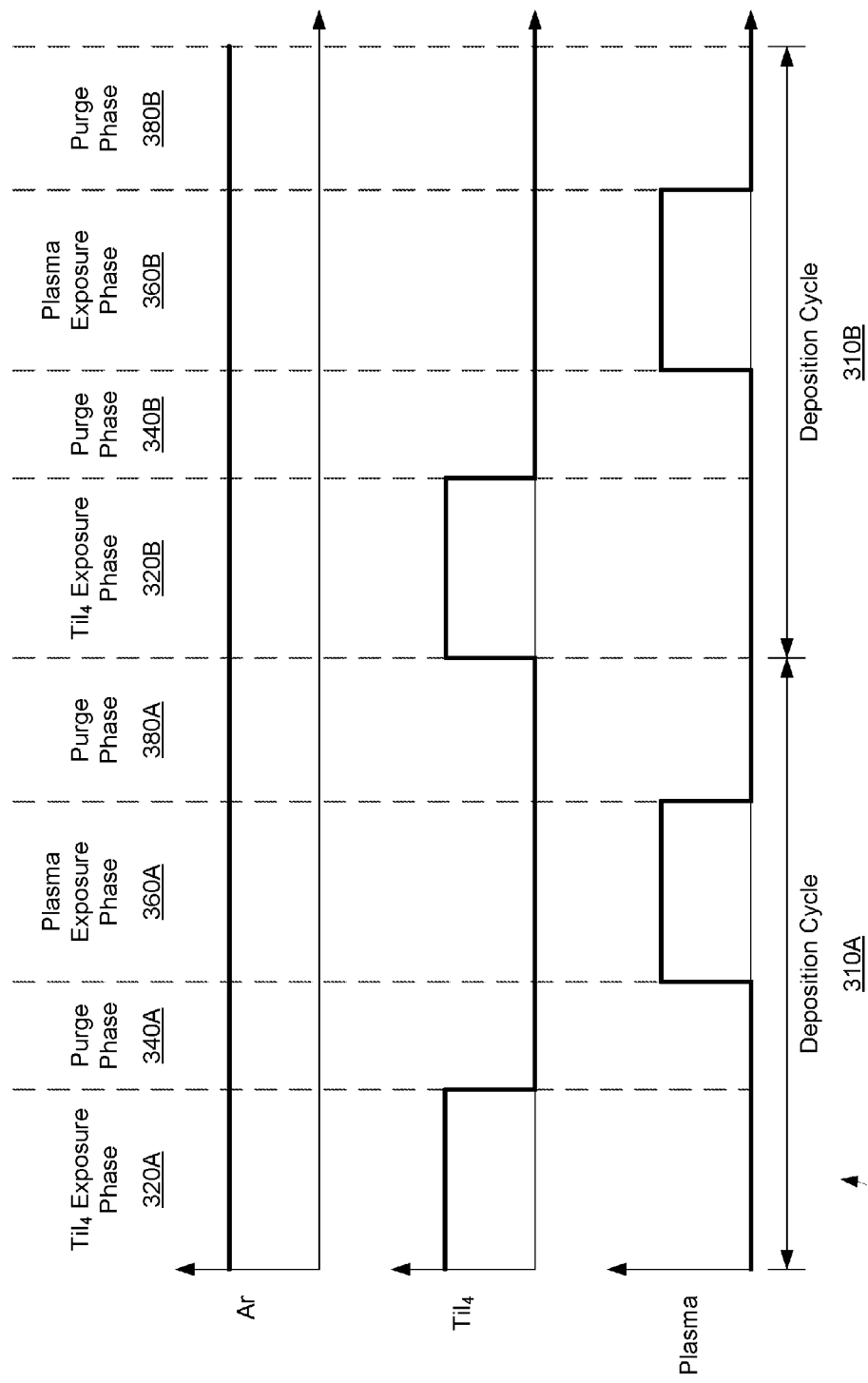
FIG. 3 illustrates timing sequence diagram of pulses according to various embodiments.

FIG. 3 is a schematic representation of a timing scheme with various exposure and purge phases. As shown, in the scheme 300, a first deposition cycle 310A may include a series of four operations (320A, 340A, 360A, 380A), which correspond with operations 204, 206, 208, and 210, respectively, in FIG. 2. Operation 204 corresponds with the TiI$_4$ exposure phase in 320A. Note during this exposure phase, argon is flowed as a carrier gas, TiI$_4$ is flowed into the chamber, and the plasma is turned off. Operation 206 corresponds with the purge phase 340A, where the TiI$_4$ exposure is turned off, the plasma is off, and only argon continues to flow. Operation 208 corresponds to plasma exposure phase 360A, where the plasma is turned on, the TiI$_4$ flow remains turned off, and argon continues to flow. The plasma helps remove any ligands, such as iodine atoms, attached to the deposited titanium to yield a highly pure titanium film. Operation 210 corresponds with purge phase 380A, where the plasma is turned off, the TiI$_4$ flow remains off, and argon continues to flow to purge any remaining TiI$_4$ or plasma. The deposition cycle 310B shows an example of a repeated deposition cycle used if an adequate thickness of the titanium film is not yet deposited on the substrate. In deposition cycle 310B, operations 204 through 210 in FIG. 2 are repeated, resulting in TiI$_4$ exposure phase 320B, purge phase 340B, plasma exposure phase 360B, and purge phase 380B, respectively. Further deposition cycles may be repeated as necessary.

Returning to FIG. 1, in operation 108, the substrate is optionally annealed at a temperature between about 300° C. and about 450° C. Annealing the substrate causes more titanium and titanium oxide layers to merge, such that some oxygen is incorporated in the titanium film and the total film deposited forms sub-stoichiometric titanium oxide. In some embodiments, the substrate is annealed for a time between about 2 seconds and about 30 minutes depending on the method and temperature of annealing. The anneal temperature and anneal time may be tuned depending on the desired sub-stoichiometric titanium oxide to be formed. In various embodiments, the thickness of deposited sub-stoichiometric titanium oxide is about 10 Å to about 50 Å thick. Deposition of titanium oxide and titanium on a silicon substrate with native oxide and subsequent post-treatment can result in the formation of sub-stoichiometric titanium oxide. Titanium can getter oxygen from the native silicon oxide present on the substrate.

Figure 4:
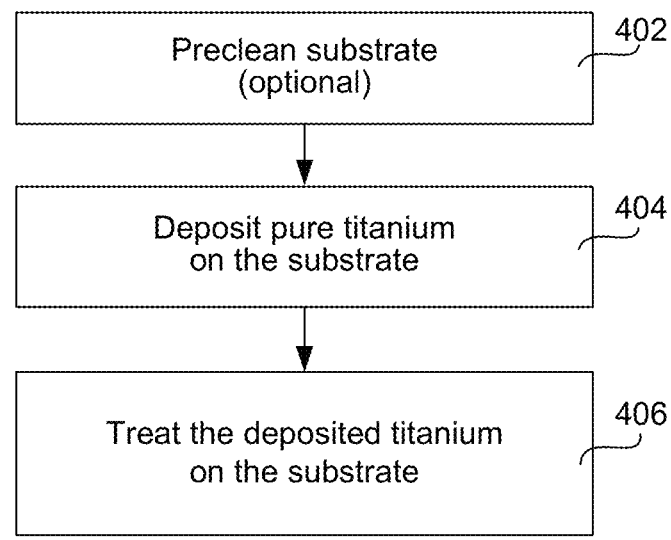
FIG. 4 is a process flow diagram illustrating operations in a method of depositing titanium oxide in accordance with various embodiments.

FIG. 4 provides another embodiment of the disclosed embodiments. A substrate including a native oxide, such as silicon oxide, is provided. In operation 402, a substrate is optionally precleaned. Precleaning methods and techniques may be any of those described above with respect to operation 102 in FIG. 1.

In operation 404, highly pure, conformal titanium is deposited on the substrate. In various embodiments, titanium is deposited in accordance with the methods described above with respect to FIGS. 2 and 3. In some embodiments, the titanium layer may be about 10 Å to about 100 Å thick. The thickness of the titanium film may depend on the desired sub-stoichiometric titanium oxide ratio between titanium and oxygen.

In operation 406, the substrate is treated. In various embodiments, treatment includes exposing the titanium layer to a reactant. Example reactants include oxygen, ozone, and water. In some embodiments, treatment includes annealing the substrate, such as by heating the substrate. For example, the substrate may be annealed by heating the substrate at a temperature between about 300° C. and about 450° C. In some embodiments, the treatment includes exposing the titanium layer to air.

In some embodiments, the treatment includes exposing the titanium layer to an oxygen source to oxidize the titanium layer on the substrate. In various embodiments, exposing the substrate to an oxygen source forms sub-stoichiometric titanium oxide. The oxygen source used may include oxygen ($O_2$), ozone ($O_3$), and nitrous oxide ($N_2O$). In some embodiments, in operation 406, sub-stoichiometric titanium oxide is formed both from the exposure to the oxygen source and a reaction between the deposited titanium and the underlying native oxide.

The substrate may be exposed to the oxygen source or reactant for a time between about 2 seconds and about 300 seconds. The oxygen source may flow at a flow rate between about 100 sccm and about 1000 sccm. The operation may be performed at a temperature less than about 450° C., or less than about 400° C. In some embodiments, the substrate is treated in a separate chamber. In some embodiments, the substrate is further annealed and/or treated after exposing the substrate to an oxygen source. In some embodiments, a thermal anneal is used to form sub-stoichiometric titanium oxide after the substrate is treated.

The treatment allows the titanium deposited on the substrate to react with the underlying native oxide to form titanium oxide. Modulating treatment conditions allows tuning of the stoichiometry of the formed titanium oxide. The embodiments described with respect to FIG. 4 may be used to deposit titanium oxide in operation 104 of FIG. 1.

Apparatus

Figure 5:
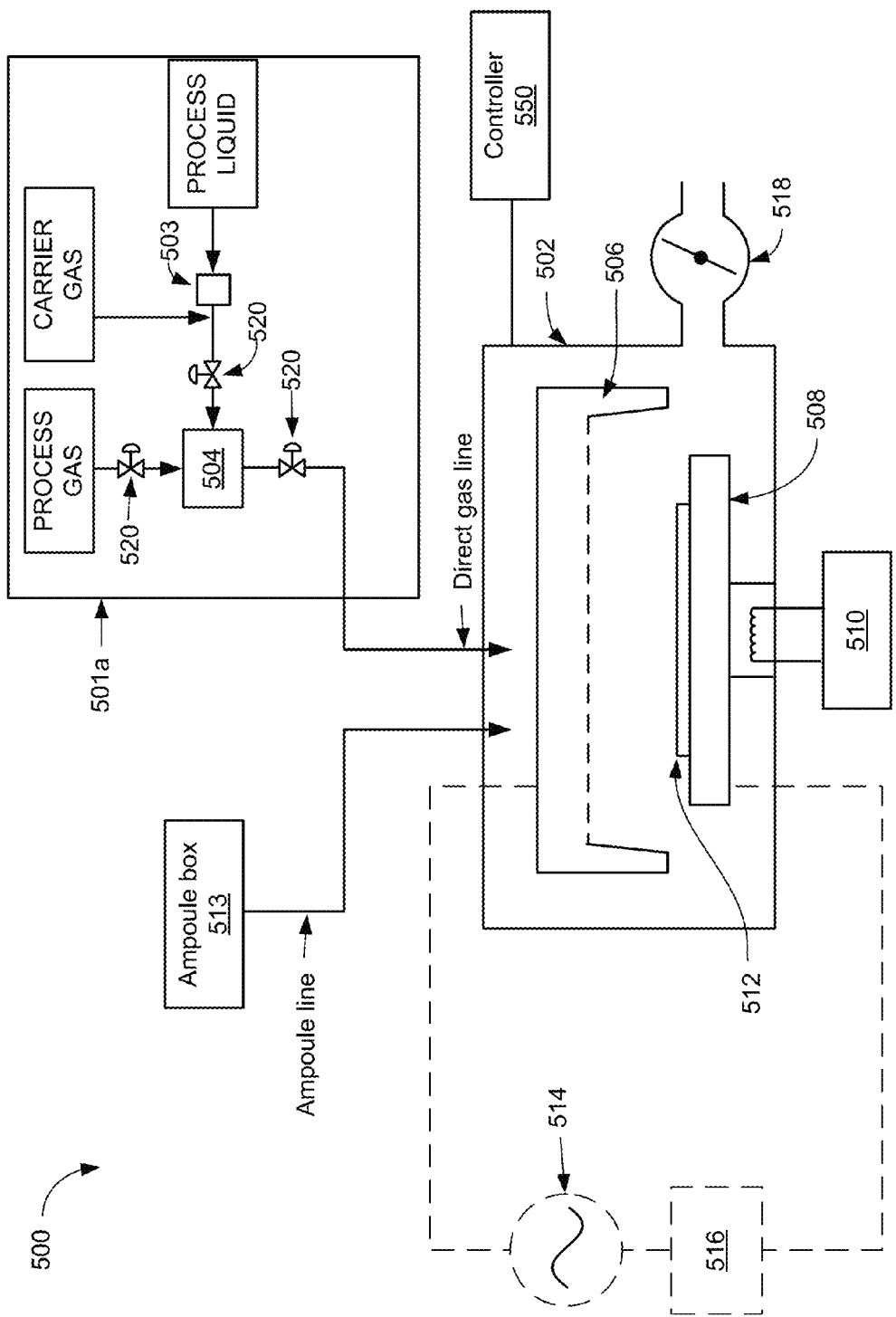
FIG. 5 is a schematic illustration of a processing chamber suitable for deposition processes in accordance with disclosed embodiments.
Figure 6:
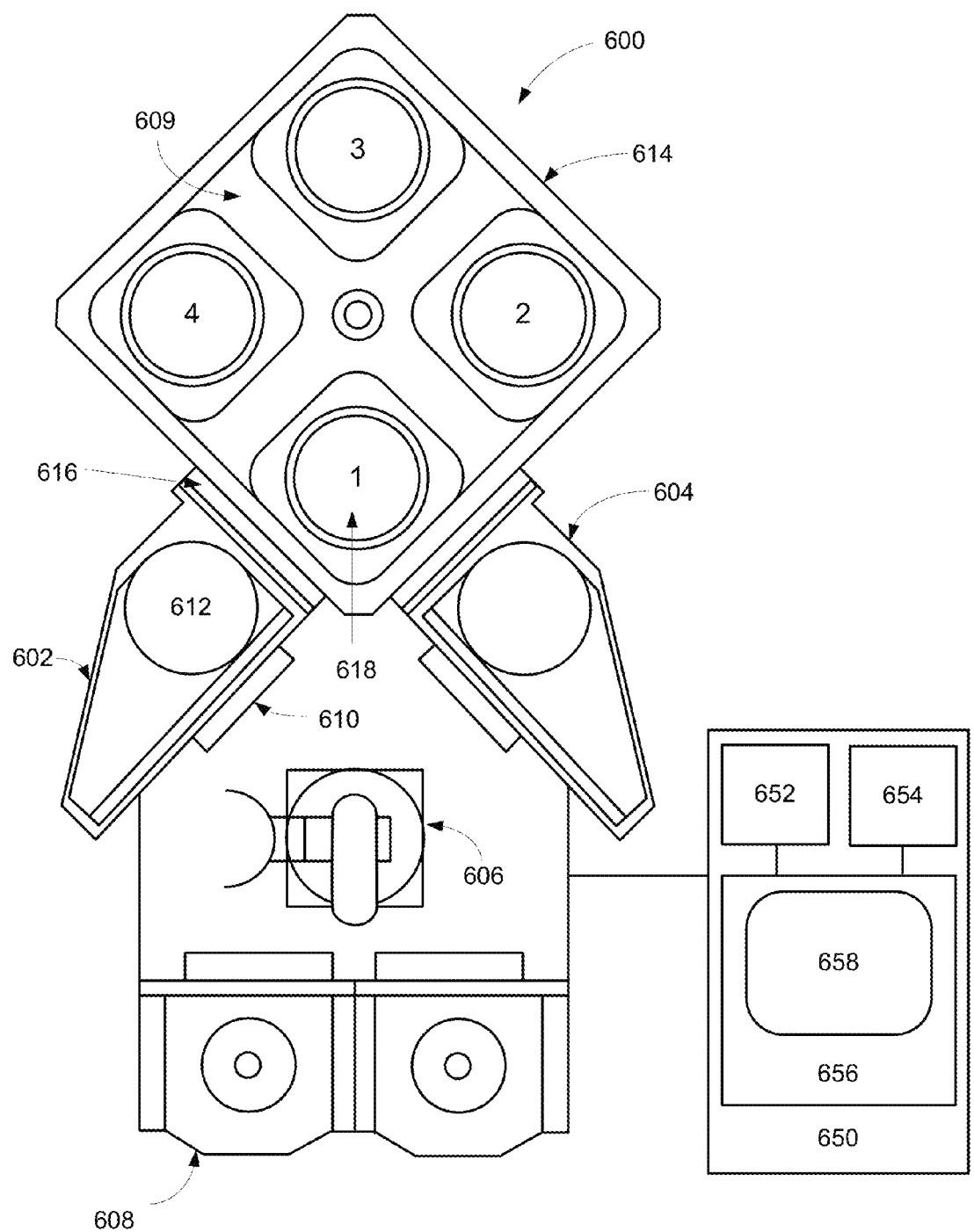
FIG. 6 is a schematic illustration of a processing system suitable for deposition processes in accordance with disclosed embodiments.

FIG. 5 depicts a schematic illustration of an embodiment of an atomic layer deposition (ALD) process station 500 having a process chamber body 502. A plurality of ALD process stations 500 may be included in a common process tool environment. For example, FIG. 6 depicts an embodiment of a multi-station processing tool 600. In some embodiments, one or more hardware parameters of ALD process station 500, including those discussed in detail below, may be adjusted programmatically by one or more computer controllers 550.

ALD process station 500 fluidly communicates with reactant delivery system 501a for delivering process gases to a distribution showerhead 506. Reactant delivery system 501a includes a mixing vessel 504 for blending and/or conditioning process gases for delivery to showerhead 506. One or more mixing vessel inlet valves 520 may control introduction of process gases to mixing vessel 504. The station 500 includes an ampoule box 513 which is connected to the chamber 502 via an ampoule line. For example, TiI$_4$ may be delivered using the reactant delivery system 501a.

As an example, the embodiment of FIG. 5 includes a vaporization point 503 for vaporizing liquid reactant to be supplied to the mixing vessel 504. In some embodiments, vaporization point 503 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 503 may be heat traced. In some examples, mixing vessel 504 may also be heat traced.

In one non-limiting example, piping downstream of vaporization point 503 has an increasing temperature profile extending from approximately 100° C. to approximately 150° C. at mixing vessel 504.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 503. In one scenario, a liquid injector may be mounted directly to mixing vessel 504. In another scenario, a liquid injector may be mounted directly to showerhead 506.

In some embodiments, a liquid flow controller (LFC) upstream of vaporization point 503 may be provided for controlling a mass flow of liquid for vaporization and delivery to process station 500. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 506 distributes process gases toward substrate 512. In the embodiment shown in FIG. 5, the substrate 512 is located beneath showerhead 506 and is shown resting on a pedestal 508. Showerhead 506 may have any suitable shape, and may have any suitable number and arrangement of ports for distributing process gases to substrate 512.

Optionally, pedestal 508 may be lowered and/or raised during portions the process to modulate process pressure, reactant concentration, etc. It will be appreciated that, in some embodiments, pedestal height may be adjusted programmatically by a suitable computer controller 550.

In another scenario, adjusting a height of pedestal 508 may allow a plasma density to be varied during plasma activation and/or treatment cycles included in the process. At the conclusion of the process phase, pedestal 508 may be lowered during another substrate transfer phase to allow removal of substrate 512 from pedestal 508.

Further, it will be appreciated that a vertical position of pedestal 508 and/or showerhead 506 may be varied by any suitable mechanism within the scope of the present disclosure. In some embodiments, pedestal 508 may include a rotational axis for rotating an orientation of substrate 512. It will be appreciated that, in some embodiments, one or more of these example adjustments may be performed programmatically by one or more suitable computer controllers 550.

In some embodiments where plasma may be used as discussed above, showerhead 506 and pedestal 508 electrically communicate with a radio frequency (RF) power supply 514 and matching network 516 for powering a plasma. In some embodiments, the plasma energy may be controlled by controlling one or more of a process station pressure, a gas concentration, an RF source power, an RF source frequency, and a plasma power pulse timing. For example, RF power supply 514 and matching network 516 may be operated at any suitable power to form a plasma having a desired composition of radical species. Examples of suitable powers are included above. Likewise, RF power supply 514 may provide RF power of any suitable frequency. In some embodiments, RF power supply 514 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 550 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as $TiI_4$ and/or an oxidant or oxygen source, such as $O_2$), instructions for setting a flow rate of a carrier gas (such as argon or nitrogen), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for setting a flow rate of an inert and/or reactant gas which may be the same as or different from the gas used in the first recipe phase (e.g., the second precursor such as argon), instructions for modulating a flow rate of a carrier gas, and time delay instructions for the third recipe phase. A fourth recipe phase may include instructions for modulating or stopping a flow rate of an inert and/or a reactant gas, instructions for modulating the flow rate of a carrier or purge gas, and time delay instructions for the fourth recipe phase. It will be appreciated that these recipe phases may be further subdivided and/or iterated in any suitable way within the scope of the present disclosure.

In some embodiments, pedestal 508 may be temperature controlled via heater 510. For example, the pedestal 508 may be heated at low temperatures such as 300° C. using the heater 510 during deposition of titanium layers. The pedestal 508 may also be heated for an anneal operation, such as the operation 108 described above with respect to FIG. 1. Further, in some embodiments, pressure control for process station 500 may be provided by butterfly valve 518. As shown in the embodiment of FIG. 5, butterfly valve 518 throttles a vacuum provided by a downstream vacuum pump (not shown). However, in some embodiments, pressure control of process station 500 may also be adjusted by varying a flow rate of one or more gases introduced to the process station 500.

As described above, one or more process stations may be included in a multi-station processing tool. FIG. 6 shows a schematic view of an embodiment of a multi-station processing tool 600 with an inbound load lock 602 and an outbound load lock 604, either or both of which may comprise a remote plasma source. A robot 606, at atmospheric pressure, is configured to move wafers from a cassette loaded through a pod 608 into inbound load lock 602 via an atmospheric port 610. A wafer is placed by the robot 606 on a pedestal 612 in the inbound load lock 602, the atmospheric port 610 is closed, and the load lock is pumped down. Where the inbound load lock 602 comprises a remote plasma source, the wafer may be exposed to a remote plasma treatment in the load lock prior to being introduced into a processing chamber 614. Further, the wafer also may be heated in the inbound load lock 602 as well, for example, to remove moisture and adsorbed gases. Next, a chamber transport port 616 to processing chamber 614 is opened, and another robot (not shown) places the wafer into the reactor on a pedestal of a first station shown in the reactor for processing. While the embodiment depicted in FIG. 6 includes load locks, it will be appreciated that, in some embodiments, direct entry of a wafer into a process station may be provided.

The depicted processing chamber 614 comprises four process stations, numbered from 1 to 4 in the embodiment shown in FIG. 6. Each station has a heated pedestal (shown at 618 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 614 may include one or more matched pairs of ALD and plasma-enhanced ALD process stations. While the depicted processing chamber 614 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 depicts an embodiment of a wafer handling system for transferring wafers within processing chamber 614. In some embodiments, wafer handling system may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog, and/or digital input/output connections, stepper motor controller boards, etc.

In some embodiments, system controller 650 controls all of the activities of process tool 600. System controller 650 executes system control software 658 stored in mass storage device 654, loaded into memory device 656, and executed on processor 652. Alternatively, the control logic may be hard coded in the controller 650. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 658 may include instructions for controlling the timing, mixture of gases, amount of sub-saturated gas flow, chamber and/or station pressure, chamber and/or station temperature, wafer temperature, target power levels, RF power levels, substrate pedestal, chuck and/or susceptor position, and other parameters of a particular process performed by process tool 600. System control software 658 may be configured in any suitable way. For example, various process tool component subroutines or control objects may be written to control operation of the process tool components necessary to carry out various process tool processes. System control software 658 may be coded in any suitable computer readable programming language.

In some embodiments, system control software 658 may include input/output control (IOC) sequencing instructions for controlling the various parameters described above. Other computer software and/or programs stored on mass storage device 654 and/or memory device 656 associated with system controller 650 may be employed in some embodiments. Examples of programs or sections of programs for this purpose include a substrate positioning program, a process gas control program, a pressure control program, a heater control program, and a plasma control program.

In some implementations, a controller 650 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 650, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 650 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 650 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 650, in some implementations, may be a part of or coupled to a computer that is integrated with, coupled to the system, otherwise networked to the system, or a combination thereof. For example, the controller 650 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 650 receives instructions in the form of data, which specify parameters for each of the processing steps to be performed during one or more operations. It should be understood that the parameters may be specific to the type of process to be performed and the type of tool that the controller 650 is configured to interface with or control. Thus as described above, the controller 650 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 650 might communicate with one or more of other tool circuits or modules, other tool components, cluster tools, other tool interfaces, adjacent tools, neighboring tools, tools located throughout a factory, a main computer, another controller 650, or tools used in material transport that bring containers of wafers to and from tool locations and/or load ports in a semiconductor manufacturing factory.

A substrate positioning program may include program code for process tool components that are used to load the substrate onto pedestal 618 and to control the spacing between the substrate and other parts of process tool 600.

A process gas control program may include code for controlling gas composition (e.g., TMA, ammonia, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 650 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 650 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

An appropriate apparatus for performing the methods disclosed herein is further discussed and described in U.S.

patent application Ser. No. 13/084,399, filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Figure 7A:
FIGS. 7A, 8A, and 9A are high resolution transmission electron microscopy (HRTEM) images of substrates processed in accordance with disclosed embodiments.

An experiment was conducted to determine the feasibility of various embodiments described herein. In the first experiment, titanium oxide was deposited on a substrate using techniques described in FIG. 1. The substrate included a silicon layer. The titanium oxide layer was deposited to a thickness of about 40±2 Å and the layer was amorphous. Titanium oxide was deposited on a Si substrate with native oxide layer present on it. The thickness of the formed silicon oxide layer was about 14 Å. FIG. 7A provides a HRTEM (high-resolution transmission electron microscopy) image of the substrate with deposited titanium oxide 701, silicon oxide formed 703, all on the silicon substrate 705. FIG. 7C provides a schematic illustration of the silicon 705 substrate, and titanium oxide 701 (silicon oxide is not shown).

Figure 7B:
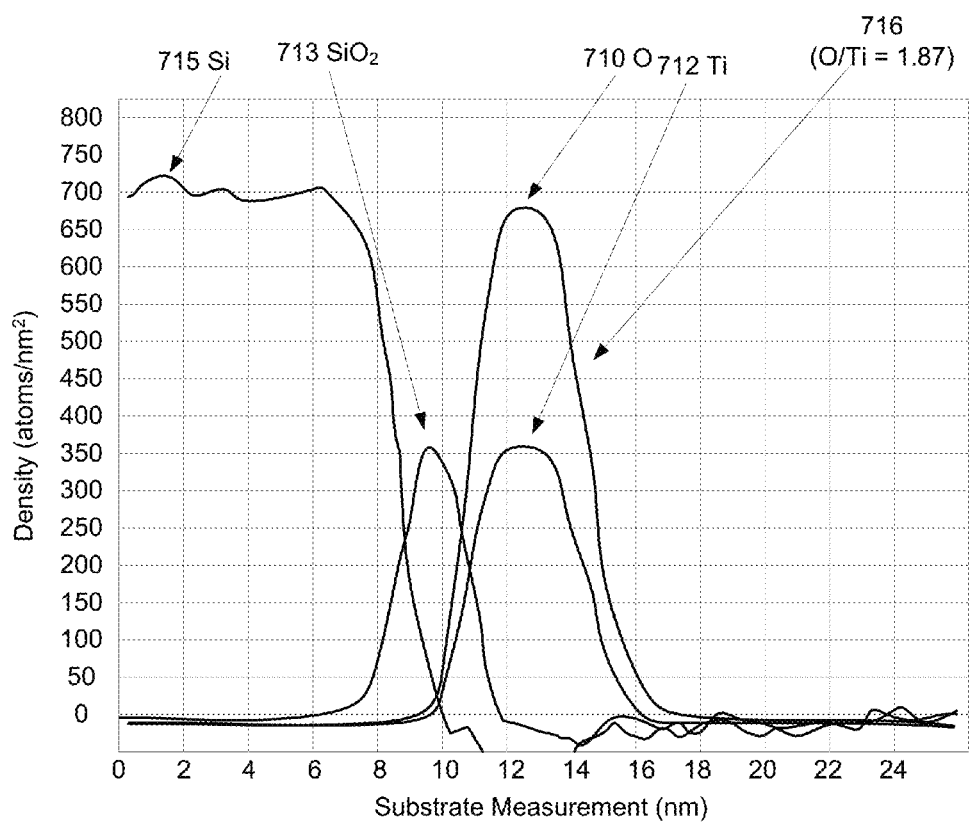
FIGS. 7B, 8B, and 9B are electron energy loss spectroscopy analysis diagrams for atomic densities for substrates processed in accordance with disclosed embodiments.
Figure 7C:
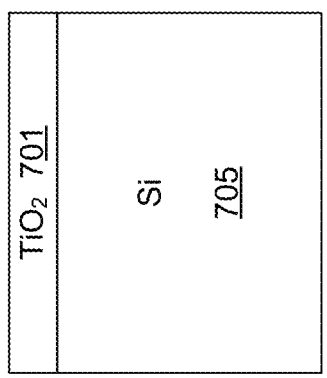

FIG. 7B depicts the relative densities of atomic compositions of the layer at various substrate thickness points as measured using electron energy loss spectroscopy (EELS). The x-axis depicts a substrate measurement, which is measured as the distance from the bottom of the layer of silicon 705. The y-axis depicts the density in atoms per nm$^2$ for various atoms. As shown, silicon 715 is shown as the atom with the highest density for the first 0-8 nm of the substrate. A thin layer of silicon oxide 713 is on the layer of silicon 715, followed by an increased density of oxygen 710 and titanium 712, which is shown in FIG. 7A as titanium oxide 701. At 716, the oxygen to titanium ratio is about 1.87, which suggests that sub-stoichiometric titanium oxide (e.g., $TiO_{1.87}$) is present on the substrate.

Figure 8C:
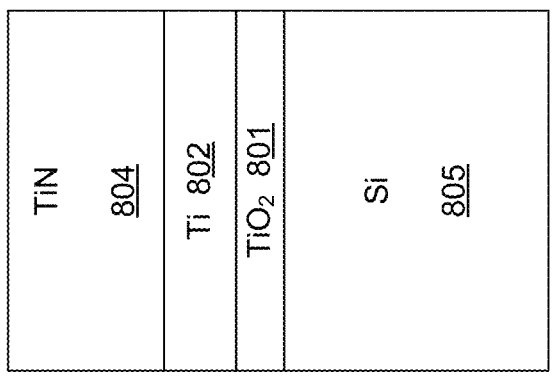
Figure 8A:
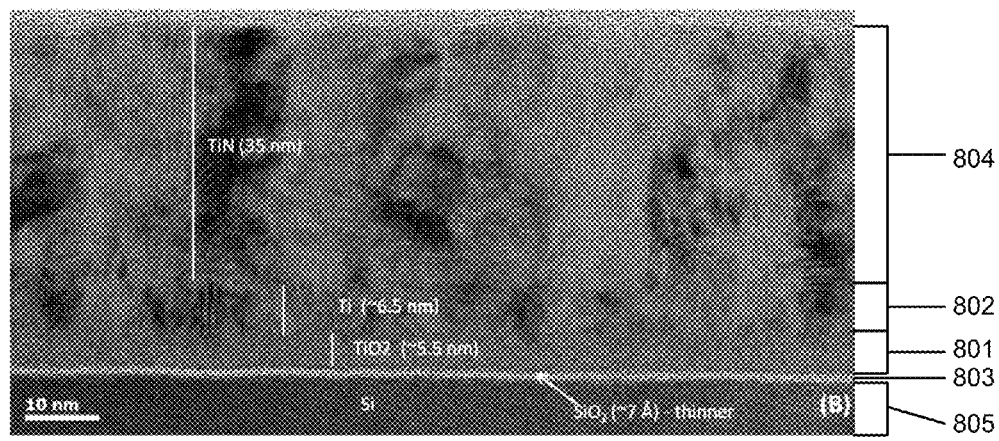

In the second experiment, the substrate from the first experiment as shown in FIGS. 7A-7C was provided. Titanium was deposited on the film and titanium nitride was deposited on the titanium film subsequently. FIG. 8A provides a HRTEM image of the substrate with deposited titanium nitride 804, titanium 802, titanium oxide 801, silicon oxide 803, all on the silicon substrate 805. Note that the thickness of the silicon oxide 803 decreased from 14 Å to 7 Å, which suggests that some oxygen was incorporated into the titanium oxide layer, which is now about 5.5 nm, which is thicker than in FIG. 7A. FIG. 8C provides a schematic illustration of the silicon 805 substrate, titanium oxide 801, titanium layer 802, and titanium nitride 804 (silicon oxide is not shown). The thickness of titanium deposited was about 100 Å. The thickness of titanium nitride deposited was about 300 Å.

Figure 8B:
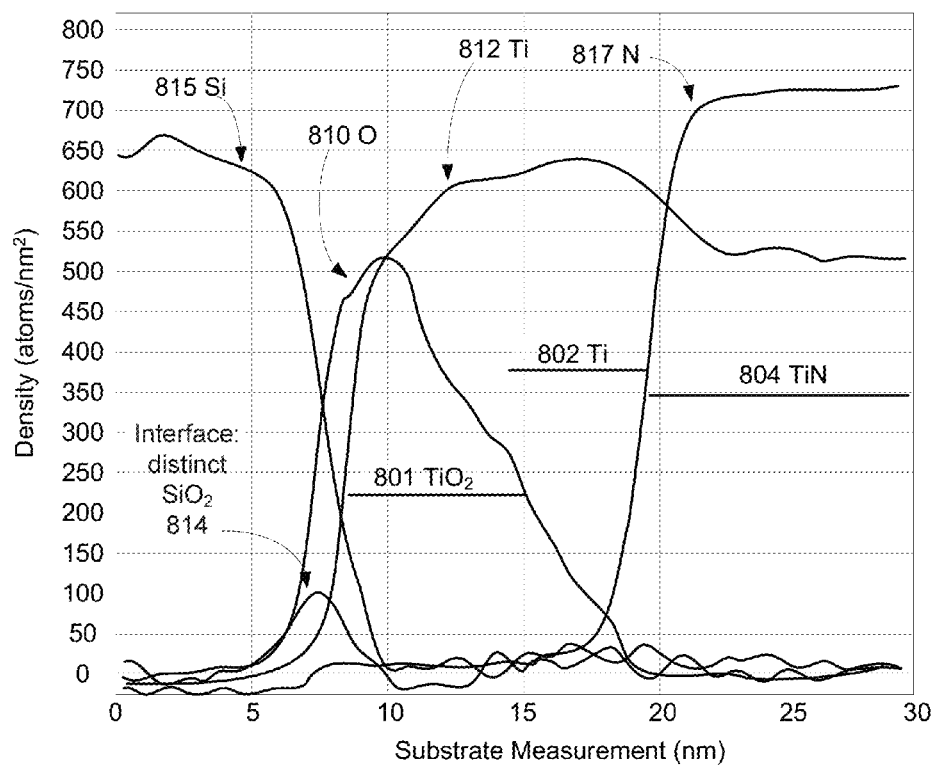

FIG. 8B depicts the relative densities of atomic compositions of the substrate at various substrate thickness points measured using EELS analysis. As shown, silicon 815 is shown as the atom with the highest density for the first 0-8 nm of the substrate. A thin layer of silicon oxide 814 is on the layer of silicon 815, followed by an increased density of oxygen 810 and titanium 812, which is shown in FIG. 8A as titanium oxide 801. On the layer of titanium oxide is a layer of titanium 802, as indicated by the high density of titanium 812. At around 18 nm, titanium nitride 804 is on the substrate, as indicated by the high densities of both the titanium 812 and nitrogen 817.

These results suggest that sub-stoichiometric titanium oxide may be formed by depositing titanium oxide and titanium on a substrate, and that such a deposition method may be used to form barrier layers for an MIS contact scheme.

In the third experiment, the substrate from the second experiment as shown in FIGS. 8A-8C was provided. The substrate was annealed at 400° C. for 2 minutes.

Figure 9C:
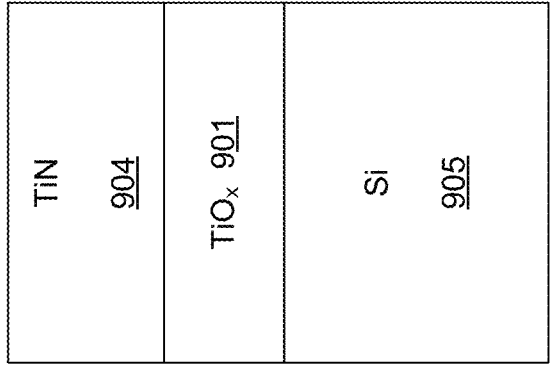
FIGS. 7C, 8C, and 9C are schematic depictions of substrates processed in accordance with disclosed embodiments.
Figure 9A:
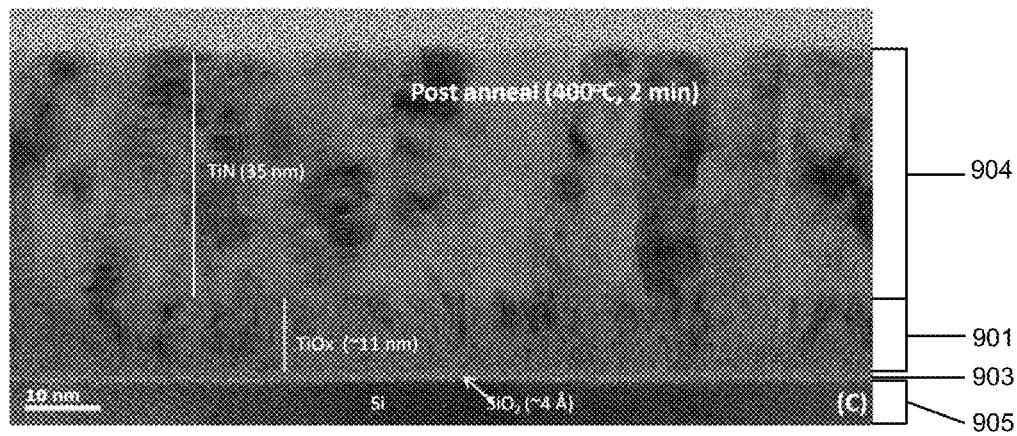

FIG. 9A provides a HRTEM image of the substrate with titanium nitride 904, titanium oxide 901, silicon oxide 903, all on the silicon substrate 905. Note that the thickness of the silicon oxide 903 decreased from 7 Å to 4 Å, which suggests that some oxygen was further incorporated into the sub-stoichiometric titanium oxide layer, which is about 11 nm due to the merging (interdiffusion) of titanium and titanium oxide layers. FIG. 9C provides a schematic illustration of the silicon 905 substrate, sub-stoichiometric titanium oxide 901, and titanium nitride 904 (silicon oxide is not shown). The total thickness of the titanium oxide layer is about 11 nm. Note the titanium layer is no longer visible. This suggests that the native oxide film is depleted of oxygen, which reacted with titanium to form titanium oxide.

Figure 9B:
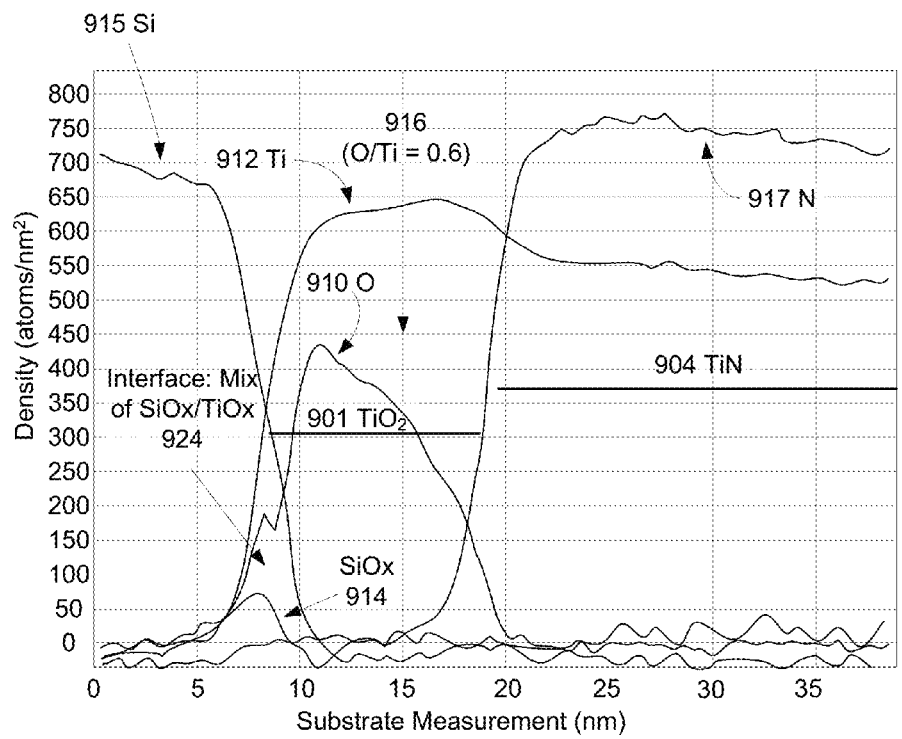
Figure 10:
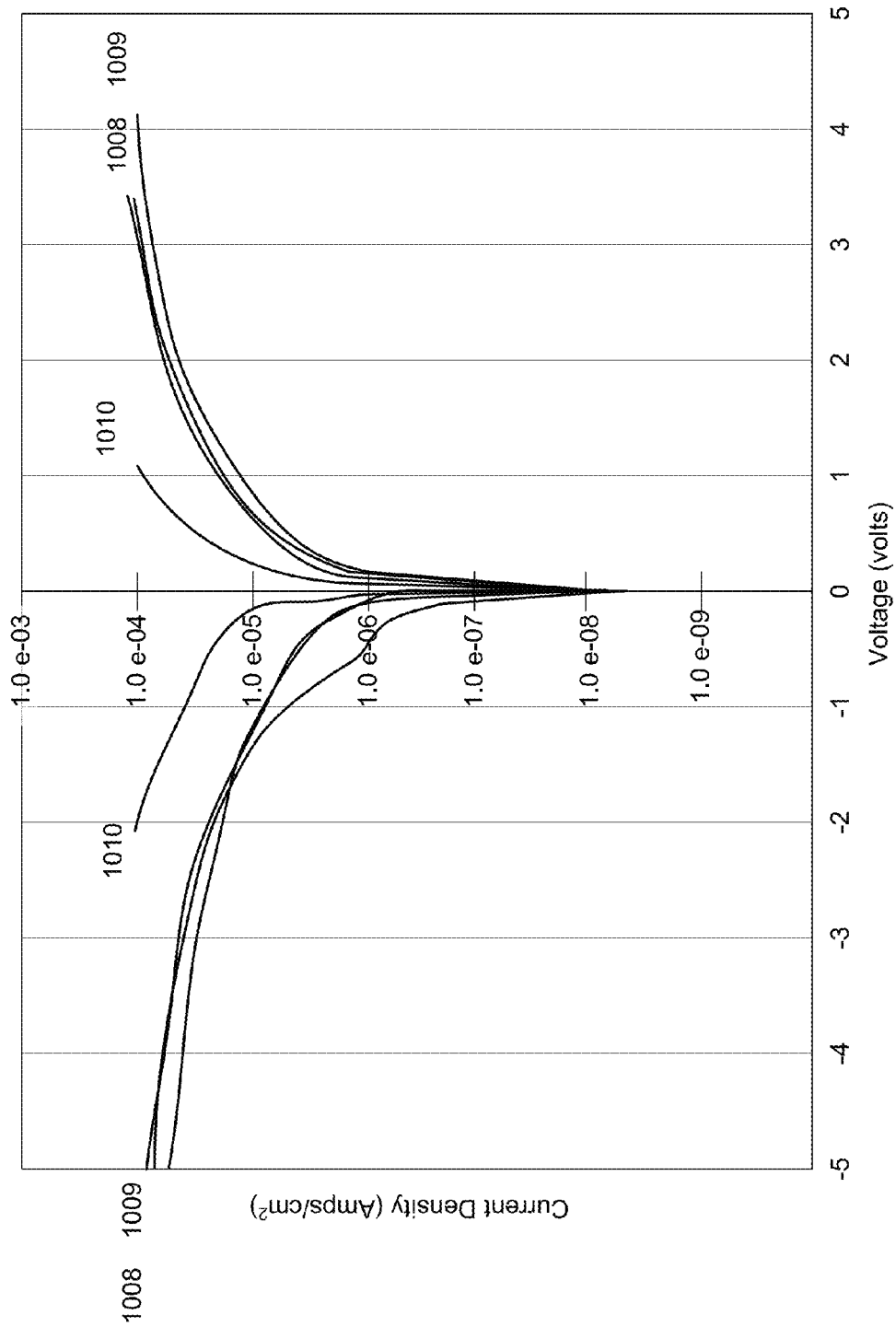
FIG. 10 is a current density diagram for substrates processed in accordance with disclosed embodiments.

FIG. 9B depicts the relative densities of atomic compositions of the substrate at various substrate thickness points measured using EELS analysis. As shown, silicon 915 is shown as the atom with the highest density for the first 0-8 nm of the substrate. A thin layer of silicon oxide 924 is on the layer of silicon 915, followed by an increased density of oxygen 910 and titanium 912, which is shown in FIG. 9A as sub-stoichiometric titanium oxide 901. On the layer of titanium oxide is a layer of titanium nitride 904, as indicated by the high density of titanium 912 and nitrogen 917. Note that at 916, the oxygen to titanium ratio is about 0.6, which indicates that sub-stoichiometric titanium oxide (e.g., $TiO_{0.6}$) is present. The film became oxygen deficient as a result of the Ti/TiN deposition and subsequent anneal.

These results suggest that annealing the substrate further provides an additional tuning condition that may be used to form sub-stoichiometric titanium oxide for an MIS contact scheme. The $TiO_2$ and Ti film thicknesses may also be tuned to vary the composition of the sub-stoichiometric titanium oxide film.

During each experiment, Hg probe measurements were made to measure current density for annealed versus non-annealed substrates. 1008 and 1009 depict curves representing non-annealed substrates, which correspond to FIGS. 7C and 8C. 1010 depicts a curve representing an annealed substrate, which corresponds to FIG. 9C. As shown, the current density for the annealed sample with sub-stoichiometric titanium oxide is an order of magnitude higher than the samples without anneal, which implies that the contact resistance is lower for sub-stoichiometric titanium oxide.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of forming titanium oxide on a semiconductor substrate in a chamber, the method comprising:
    (a) depositing titanium on the substrate, wherein depositing titanium comprises:
        (i) exposing the substrate to titanium tetraiodide,
        (ii) purging the chamber,
        (iii) exposing the substrate to an ignited plasma, and
        (iv) purging the chamber, and
        (v) repeating (i) through (iv) until the desired thickness of titanium is deposited; and
    (b) treating the substrate to form sub-stoichiometric titanium oxide,
    wherein the sub-stoichiometric titanium oxide comprises titanium oxide having the chemical formula $TiO_x$, where x<2.

2. The method of claim 1, wherein the titanium is deposited at a temperature less than about 400° C.

3. The method of claim 1, further comprising prior to depositing the titanium, depositing a layer of titanium oxide on the substrate.

4. The method of claim 3, wherein the layer of titanium oxide is formed by exposing the substrate to a titanium-containing precursor.

5. The method of claim 1, wherein treating the substrate comprises exposing the substrate to a titanium-containing precursor and an oxidant.

6. The method of claim 5, wherein the oxidant is selected from the group consisting of oxygen, nitrous oxide, water vapor, hydrogen peroxide, and ozone.

7. The method of claim 1, wherein treating the substrate comprising annealing the substrate.

8. The method of claim 7, wherein the substrate is annealed by heating to a temperature between about 300° C. and about 450° C.

9. The method of claim 1, wherein the substrate comprises silicon oxide.

10. The method of claim 1, wherein the sub-stoichiometric titanium oxide is deposited to a thickness between about 10 Å to about 50 Å.

11. The method of claim 1, further comprising prior to depositing the titanium, pre-cleaning the substrate.

12. The method of claim 1, wherein the substrate is exposed to a carrier gas throughout (i) through (v).

13. The method of claim 1, wherein the plasma is generated remotely.

14. The method of claim 1, wherein the plasma is generated in the chamber.

15. The method of claim 1, wherein the substrate is exposed to titanium tetraiodide in (i) for a duration between about 1 second and about 30 seconds, the substrate is purged in (ii) and (iv) each for a duration between about 1 second and about 5 seconds, and the substrate is exposed to hydrogen and plasma in (iii) for a duration between about 1 second and about 10 seconds.

16. The method of claim 1, wherein the substrate comprises features.

17. A method of forming titanium oxide on a semiconductor substrate in a chamber, the method comprising:
    (a) depositing titanium on the substrate, wherein depositing titanium comprises:
        (i) exposing the substrate to titanium tetraiodide,
        (ii) purging the chamber,
        (iii) exposing the substrate to an ignited plasma, and
        (iv) purging the chamber, and
        (v) repeating (i) through (iv) until the desired thickness of titanium is deposited; and
    (b) treating the substrate to form sub-stoichiometric titanium oxide,
    wherein the titanium deposited in (a) has less than about 1% contamination wherein the sub-stoichiometric titanium oxide comprises titanium oxide having the chemical formula $TiO_x$, where x<2.

* * * * *